(12) United States Patent
Lee et al.

(10) Patent No.: US 11,948,481 B2
(45) Date of Patent: Apr. 2, 2024

(54) DISPLAY DEVICE AND MANUFACTURING METHOD OF DISPLAY DEVICE

(71) Applicant: Samsung Display Co., LTD., Yongin-si (KR)

(72) Inventors: Jung Hun Lee, Hwaseong-si (KR); Jung Il Lee, Seoul (KR); Ji Heon Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 363 days.

(21) Appl. No.: 17/337,568

(22) Filed: Jun. 3, 2021

(65) Prior Publication Data
US 2022/0058991 A1 Feb. 24, 2022

(30) Foreign Application Priority Data
Aug. 18, 2020 (KR) .......... 10-2020-0103228

(51) Int. Cl.
*G09F 9/30* (2006.01)
*H10K 102/00* (2023.01)

(52) U.S. Cl.
CPC ........ *G09F 9/301* (2013.01); *H10K 2102/311* (2023.02)

(58) Field of Classification Search
CPC ...................................... G09F 9/301
See application file for complete search history.

(56) References Cited

U.S. PATENT DOCUMENTS

| 10,664,018 B1* | 5/2020 | Zhai | G06F 1/1681 |
| 2016/0295709 A1* | 10/2016 | Ahn | G06F 1/1652 |
| 2018/0145269 A1* | 5/2018 | Myeong | G06F 1/1681 |
| 2018/0341293 A1* | 11/2018 | Kim | G06F 1/1652 |

FOREIGN PATENT DOCUMENTS

| KR | 1020160144912 A | 12/2016 |
| KR | 101834793 B1 | 3/2018 |
| KR | 1020180060205 A | 6/2018 |
| KR | 1020190080740 A | 7/2019 |

\* cited by examiner

*Primary Examiner* — Sherman Ng
(74) *Attorney, Agent, or Firm* — CANTOR COLBURN LLP

(57) ABSTRACT

A display device includes a display panel including one surface, on which an image is displayed, and an opposing surface opposite to the one surface; a support plate disposed on the opposing surface of the display panel and including one surface facing the display panel, an opposing surface opposite to the one surface thereof, where a plurality of openings is defined through the support plate from the one surface to the opposing surface thereof in a thickness direction such that the support plate further includes inclined inner peripheral surfaces defining the plurality of openings; and a coating layer disposed to surround the one surface of the support plate, the opposing surface of the support plate, and the inner peripheral surfaces of the support plate defining the plurality of openings.

15 Claims, 21 Drawing Sheets

DISPLAY DEVICE AND MANUFACTURING METHOD OF DISPLAY DEVICE

This application claims priority to Korean Patent Application No. 10-2020-0103228, filed on Aug. 18, 2020, and all the benefits accruing therefrom under 35 U.S.C. § 119, the content of which in its entirety is herein incorporated by reference.

BACKGROUND

1. Field

The disclosure relates to a display device and a manufacturing method of the display device.

2. Description of the Related Art

A display device is a device for displaying images and typically includes a display panel such as a liquid crystal display panel, or an organic light emitting display panel having organic light emitting diodes ("OLED") or quantum dot electroluminescence ("QD-EL") elements.

Recently, a foldable display device including a flexible display panel attracts much attention. Since the foldable display device has a wide screen with high portability, the foldable display device has both desired characteristics of a smartphone and a tablet personal computer (PC).

SUMMARY

In a foldable display device, fatigue fracture may occur due to repeated folding and unfolding of a member supporting a flexible display panel.

Embodiments of the disclosure provide a display device capable of reducing fatigue fracture of a support member supporting a display panel.

An embodiment of a display device includes one surface on which an image is displayed, and an opposing surface opposite to the one surface; a support plate disposed on the opposing surface of the display panel and including one surface facing the display panel, and an opposing surface opposite to the one surface thereof, where a plurality of openings is defined through the support plate from the one surface to the opposing surface thereof in a thickness direction, such that the support plate further includes inclined inner peripheral surfaces defining the plurality of openings; and a coating layer disposed to surround the one surface of the support plate, the opposing surface of the support plate, and the inner peripheral surfaces of the support plate defining the plurality of openings.

An embodiment of a manufacturing method of a display device includes forming a plurality of openings in a support plate; and forming a first cured layer on one surface of the support plate and a first inclined surface of each of inner peripheral surfaces of the support plate defining the plurality of openings, and forming a second cured layer on an opposing surface of the support plate, which is opposite to the one surface of the support plate, and a second inclined surface of each of the inner peripheral surfaces of the support plate defining the plurality of openings, where the first cured layer and the second cured layer are connected to each other in the plurality of openings to cover the inner peripheral surfaces of the support plate defining the plurality of openings.

In embodiments of the display device in accordance with the invention, a plurality of openings is defined through a support member that supports a display panel to improve flexibility and the support member may have improved durability by including a coating layer coated thereon.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
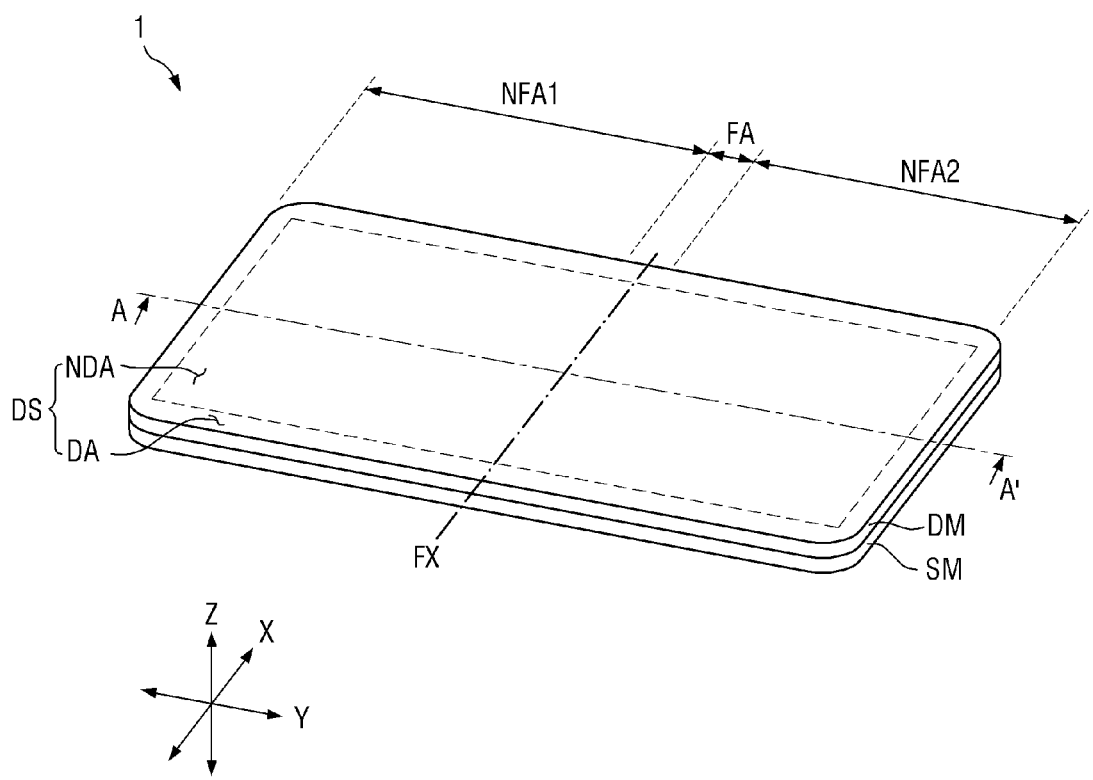
FIG. 1 is a perspective view of a display device according to an embodiment.

The invention will now be described more fully hereinafter with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
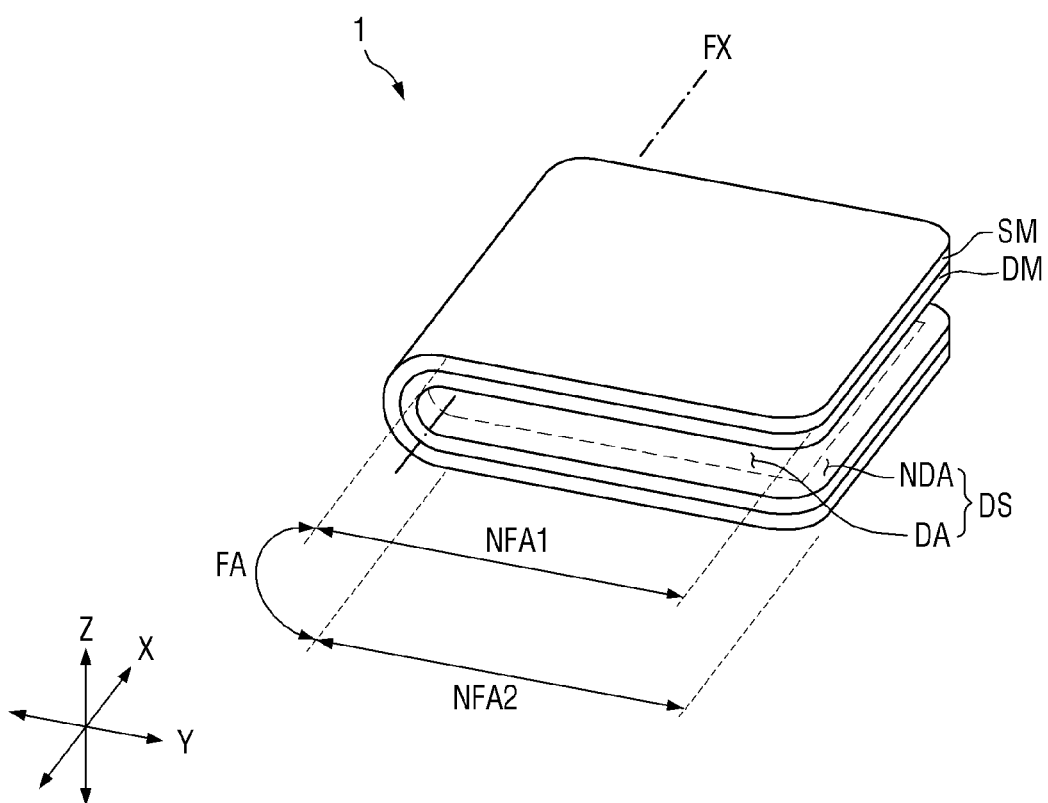
FIG. 2 is a perspective view of the display device of FIG. 1 in an in-folding state.
Figure 3:
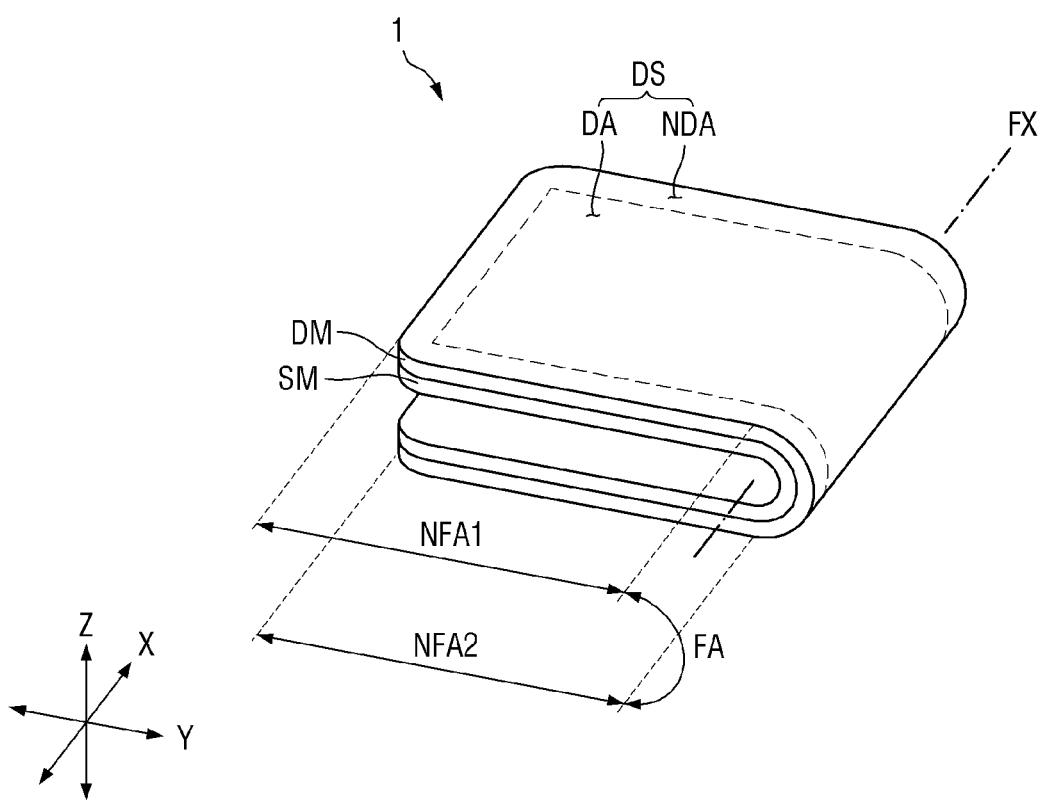
FIG. 3 is a perspective view of the display device of FIG. 2 in an out-folding state.
Figure 4:
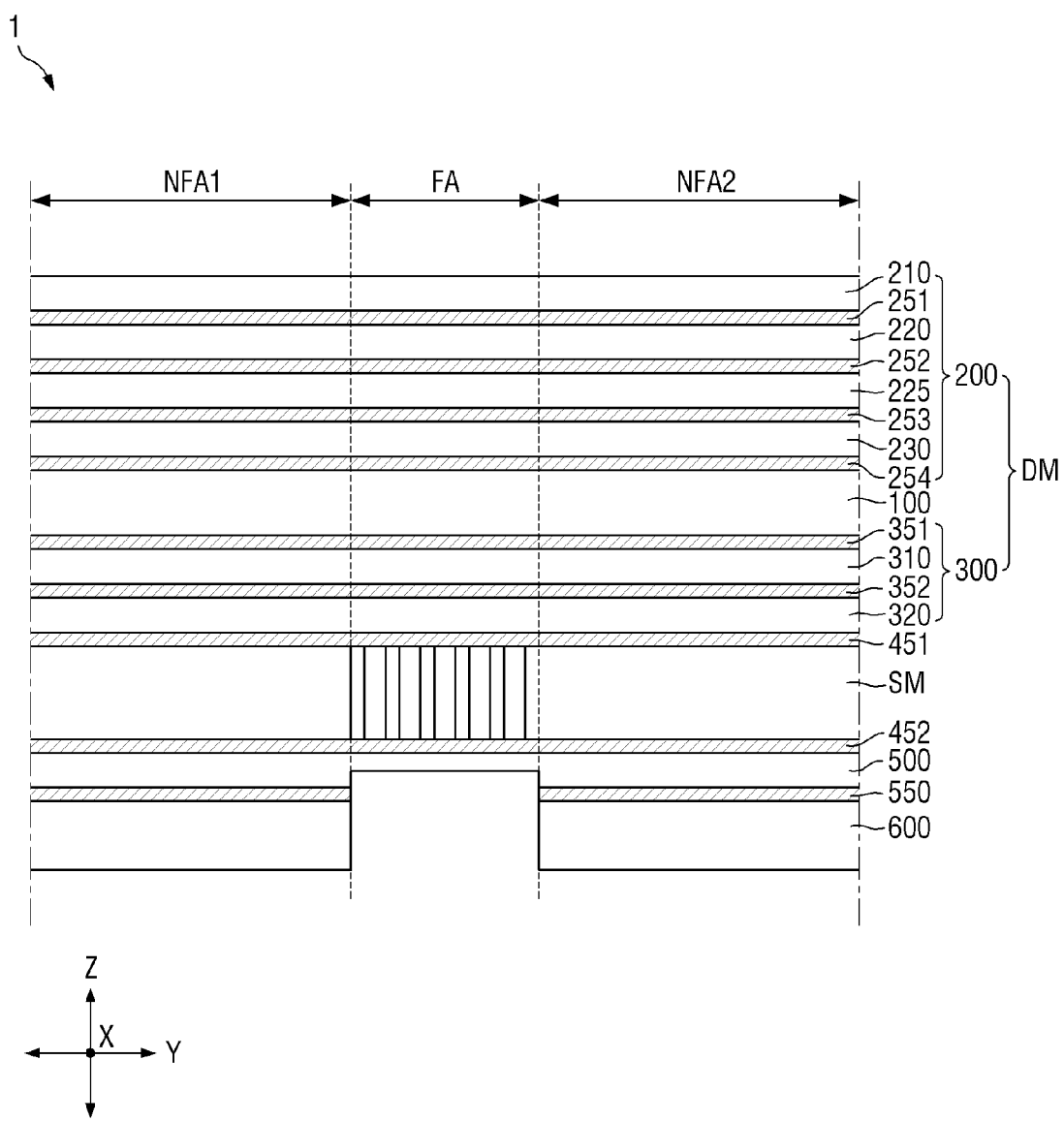
FIG. 4 is a cross-sectional view taken along line A-A' of FIG. 1.
Figure 5:
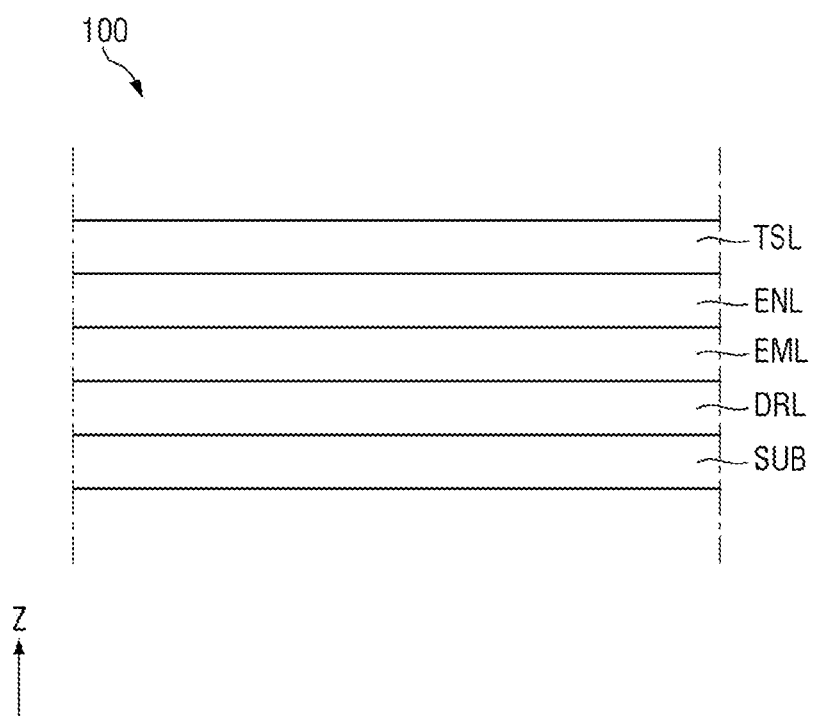
FIG. 5 is a cross-sectional view of a display panel.

FIG. 1 is a perspective view of a display device according to an embodiment. FIG. 2 is a perspective view of the display device of FIG. 1 in an in-folding state. FIG. 3 is a perspective view of the display device of FIG. 2 in an out-folding state. FIG. 4 is a cross-sectional view taken along line A-A' of FIG. 1. FIG. 5 is a cross-sectional view of a display panel.

Herein, a first direction X, a second direction Y and a third direction Z cross each other in different directions. The first direction X, the second direction Y and the third direction Z may be a length direction, a width direction and a thickness direction of a display device, respectively. The first direction X, the second direction Y, and the third direction Z may include two or more directions. For example, the third direction Z may include an upward direction toward the upper side of the drawing and a downward direction toward the lower side of the drawing. In this case, one surface of a member that faces upward may be referred to as top surface, and an opposing surface of the member that faces downward may be referred to as bottom surface. It should be understood, however, that the directions indicate relative directions and are not limited to the above examples.

An embodiment of a display device 1 may include various devices for displaying a screen or an image. Examples of the display device 1 may include, but are not limited to, a smartphone, a mobile phone, a tablet personal computer ("PC"), a personal digital assistant ("PDA"), a portable multimedia player ("PMP"), a television, a game machine, a wristwatch-type electronic device, a head-mounted display, a monitor of a personal computer, a laptop computer, a car navigation system, a car's dashboard, a digital camera, a camcorder, an external billboard, an electronic billboard, various medical devices, various inspection devices, various household appliances such as a refrigerator and a washing machine including a display portion, an Internet-of-Things device, and the like.

Referring to FIGS. 1 and 2, an embodiment of the display device 1 may have a rectangular shape in a plan view, e.g., a top plan view. In an embodiment, the display device 1 may have both long sides extending in the first direction X and both short sides extending in the second direction Y crossing the first direction X, in a plan view. However, the disclosure is not limited thereto, and the shape of the display device 1 may be variously modified.

The display device 1 may include a top surface and a bottom surface. The display device 1 may further include at least one side surface between the top surface and the bottom surface.

The display device 1 includes at least one display surface DS. In one embodiment, for example, the display surface DS may be the top surface of the display device 1. The display surface DS may be disposed across a folding area FA and non-folding areas NFA1 and NFA2, which will be described later. In an embodiment, both the top and bottom surfaces of the display device 1 may be the display surfaces DS. In an embodiment, the plurality of the display surfaces DS may be two or more surfaces among the top, bottom, and side surfaces of the display device 1.

The display surface DS may include a display area DA and a non-display area NDA.

The display area DA displays an image or a video. A plurality of pixels may be disposed in the display area DA.

The non-display area NDA does not display an image or a video. The non-display area NDA is disposed around the display area DA. The non-display area NDA may surround the display area DA. In one embodiment, for example, the display area DA may have a rectangular shape, and the non-display area NDA may be disposed around four sides of the display portion, but the disclosure is not limited thereto. A black matrix may be disposed in the non-display area NDA to prevent light emitted from adjacent pixels from leaking out.

The display device 1 may be a foldable device. The display device 1 may be at least partially bent to be folded or unfolded. In an embodiment, the display device 1 may be folded in a way such that a part of the display device 1 overlaps the other part or is inclined with respect to the other part, or the display device 1 may be unfolded to be entirely flat. In one embodiment, for example, the display device 1 may be folded in a way such that a part of the display device 1 is inclined with respect to the other part at an angle greater than about 0 degrees and less than about 180 degrees, or the display device 1 may be unfolded at an angle of about 180 degrees.

The display device 1 may be in-folded and/or out-folded.

In an embodiment, as shown in FIG. 2, when the display device 1 is in-folded, folding may be performed in a way such that a part of the display surface DS of the display device 1 faces the other part of the display surface DS. In an embodiment, as shown in FIG. 3, when the display device 1 is out-folded, folding may be performed in a way such that a part of the display surface DS of the display device 1 does not face the other part. In an embodiment, when the display device 1 is out-folded, folding may be performed in a way such that a part of a surface opposite to the display surface DS of the display device 1 faces the other part of the surface opposite to the display surface DS. In an embodiment, the display device 1 may be a bidirectional foldable device that may be in-folded and out-folded.

The display device 1 may be in a folded state or an unfolded state. The folded state includes a state in which the display device 1 is bent. In an embodiment, the folded state may be a state in which the display device is bent in a way such that a part of the display device 1 is inclined with respect to the other part. The unfolded state may be a state in which a part and the other part of the display device 1 are disposed side by side on a plane. Alternatively, the folded state may be a state in which an angle between a part and the other part of the display device 1 is greater than about 0 degrees and less than about 180 degrees and/or the angle is greater than about 180 degrees and less than about 360 degrees. The unfolded state may be a state in which an angle between a part and the other part of the display device 1 is about 180 degrees. Here, the part and the other part may be the non-folding areas NFA1 and NFA2, respectively, which will be described later.

The folded state may include at least one of the in-folding state in which a part of the display surface DS of the display device 1 faces the other part of the display surface DS as shown in FIG. 2 and the out-folding state in which a part of the surface opposite to the display surface DS of the device 1 faces the other part of the surface opposite to the display surface DS.

In an embodiment, as shown in FIG. 1, the display device 1 may be divided into the folding area FA and the non-folding areas NFA1 and NFA2. The folding area FA is an area that is folded or bent as the display device 1 is folded. The non-folding areas NFA1 and NFA2 are areas that are not folded or bent. The non-folding areas NFA1 and NFA2 may include a first non-folding area NFA1 and a second non-folding area NFA2.

In one embodiment, the first non-folding area NFA1 and the second non-folding area NFA2 may be arranged in the second direction Y, and the folding area FA may be disposed between the first non-folding area NFA1 and the second non-folding area NFA2. In one embodiment, for example, a single folding area FA and two non-folding areas NFA1 and NFA2 are defined in the display device 1, but the disclosure is not limited thereto.

In an alternative embodiment, a plurality of folding areas FA and non-folding areas NFA1 and NFA2 may be defined in the display device 1. Although the first non-folding area NFA1, the second non-folding area NFA2, and the folding area FA have been described with respect to the display device 1, the components of the display device 1 may also be divided into the first non-folding area NFA1, the second non-folding area NFA2 and/or the folding area FA.

The display device 1 may be folded or unfolded with respect to a folding axis FX. The folding axis FX may be arranged to overlap the folding area FA in the thickness direction. In one embodiment, for example, the display device 1 may be folded or unfolded with respect to the folding axis FX arranged in the first direction X, but the disclosure is not limited thereto. The folding axis FX may include at least one rotational axis.

The display device 1 may include a display module DM and a support member SM that supports the display module DM. In an embodiment, the display module DM may be disposed to form the top surface of the display device 1, and the support member SM may be disposed on the bottom surface of the display module DM to support the display module DM.

At least a part of the display module DM and the support member SM has flexibility. The display module DM and the support member SM may be disposed over the first non-folding area NFA1, the folding area FA and the second non-folding area NFA2, and may be folded with respect to the folding axis FX.

Referring further to FIGS. 4 and 5, the display module DM may include a display panel 100, an upper laminated structure 200 disposed on the top surface of the display panel 100, and a lower laminated structure 300 disposed on the bottom surface of the display panel 100. The top surface of the display panel 100 may be a surface on which a screen is displayed. In one embodiment, the display panel 100, the upper laminated structure 200, and the lower laminated structure 300 may be disposed across the first non-folding area NFA1, the folding area FA, and the second non-folding area NFA2.

The display panel 100 is a panel for displaying a screen or an image. Examples of the display panel 100 may include not only a self-light emitting display panel such as an organic light emitting display ("OLED") panel, an inorganic electroluminescence ("EL") display panel, a quantum dot light emitting display ("QED") panel, a micro-light emitting diode ("micro-LED") display panel, a nano-light emitting diode ("nano-LED") display panel, a plasma display panel ("PDP"), a field emission display ("FED") panel and a cathode ray tube ("CRT") display panel, but also a light receiving display panel such as a liquid crystal display ("LCD") panel and an electrophoretic display ("EPD") panel. Hereinafter, for convenience of description, embodiments where the display panel is the organic light emitting display panel will be described in detail, and the organic light emitting display panel will be simply referred to as the display panel 100 unless the context clearly indicates otherwise. However, the embodiments are not limited to the organic light emitting display panel, and other display panels mentioned above or known in the art may be applied within the scope of the teachings herein.

The display panel 100 may further include a touch member. The touch member may be provided as a panel or film separate from the display panel 100 and attached onto the display panel 100, but may also be provided in the form of a touch layer inside the display panel 100. In an embodiment, the touch member may be provided inside the display panel 100 and included in the display panel 100, but the disclosure is not limited thereto.

Referring to FIG. 5, an embodiment of the display panel 100 may include a substrate SUB, a circuit driving layer DRL on the substrate SUB, a light emitting layer EML on the circuit driving layer DRL, and an encapsulation layer ENL on the light emitting layer EML, and a touch layer TSL on the encapsulation layer ENL.

The substrate SUB may be a flexible substrate including a flexible polymer material such as polyimide or the like. Accordingly, the display panel 100 may be curved, bent, folded or rolled. In an embodiment, the substrate SUB may include a plurality of sub-substrates overlapping in a thickness direction with a barrier layer interposed therebetween. In such an embodiment, each sub-substrate may be a flexible substrate.

The circuit driving layer DRL may be disposed on the substrate SUB. The circuit driving layer DRL may include a circuit that drives the light emitting layer EML of the pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with various luminance levels corresponding to a driving signal transmitted from the circuit driving layer DRL.

The encapsulation layer ENL may be disposed on the light emitting layer EML. The encapsulation layer ENL may include an inorganic layer or a laminated layer of an inorganic layer and an organic layer.

The touch layer TSL may be disposed on the encapsulation layer ENL. The touch layer TSL is a layer for recognizing a touch input, and may function as a touch member. The touch layer TSL may include a plurality of sensing areas and sensing electrodes.

Referring back to FIG. 4, the upper laminated structure 200 is disposed on the top surface of the display panel 100. The upper laminated structure 200 may include a polarization member 230, an impact absorbing layer 225, a cover window 220, and a cover window protection layer 210, which are sequentially laminated upward from the display panel 100.

The polarization member 230 polarizes light passing therethrough. The polarization member 230 may serve to reduce the reflection of external light. In one embodiment, for example, the polarization member 230 may be a polarizing film. The polarizing film may include a polarizing layer and protective members, between which the polarizing layer is interposed. The polarizing layer may include a polyvinyl alcohol film. The polarizing layer may be stretched in one direction. The stretching direction of the polarizing layer may be an absorption axis, and a direction perpendicular thereto may be a transmission axis. The protective members may be disposed on one surface and an opposing surface of the polarizing layer, respectively. The protective member may include or be made of cellulose resin such as triacetyl cellulose, polyester resin, or the like, but is not limited thereto.

The impact absorbing layer 225 may be disposed above the polarization member 230. The impact absorbing layer 225 may absorb the impact applied to the top surface of the display device 1. In one embodiment, for example, the impact absorbing layer 225 may include a thin film type member. In an alternative embodiment, the impact absorbing layer 225 may be omitted.

The cover window 220 may be disposed on the top surface of the impact absorbing layer 225. The cover window 220 serves to protect the display panel 100. The cover window 220 may include or be made of a transparent material. The cover window 220 may include, for example, glass or plastic.

In an embodiment where the cover window 220 includes glass, the glass may be ultra-thin glass ("UTG") or thin glass. In an embodiment where the glass is UTG or thin glass, the glass may have a flexible property such that the glass may be curved, bent, folded, or rolled. The thickness of the glass may be, for example, in a range of about 10 micrometers (μm) to about 300 μm, e.g., in a range of about 30 μm to 80 about μm or may be about 50 μm. The glass of the cover window 220 may include soda-lime glass, alkali aluminosilicate glass, borosilicate glass, or lithium alumina silicate glass. The glass of the cover window 220 may include chemically strengthened or thermally strengthened glass to have strong rigidity. Chemical strengthening may be achieved through an ion exchange process in alkaline salts. The ion exchange process may be performed two or more times.

In an embodiment, where the cover window 220 includes plastic, the plastic may be improved flexibility such as folding. In an embodiment, the plastic applicable to the cover window 220 may include, but not limited to, polyimide, polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, ethylene vinylalcohol copolymer, polyethersulphone ("PES"), polyetherimide ("PEI"), polyphenylene sulfide ("PPS"), polyarylate ("PAR"), triacetyl cellulose ("TAC"), and cellulose acetate propionate ("CAP"). The plastic cover window 220 may include one or more of the plastic materials mentioned above.

The cover window protection layer 210 may be disposed on the front side of the cover window 220. The cover window protection layer 210 may perform at least one selected from functions of prevention of scattering, impact absorption, prevention of scratch, prevention of fingerprint smudges and prevention of glare on the cover window 220. The cover window protection layer 210 may include a transparent polymer film. The transparent polymer film include at least one selected from polyethylene terephthalate ("PET"), PEN, PES, polyimide ("PI"), PAR, PC, PMMA, and cycloolefin copolymer ("COC").

The upper laminated structure 200 may include upper bonding members 251, 252, 253, and 254 for bonding adjacently laminated members.

In one embodiment, for example, a first bonding member 251 may be disposed between the cover window 220 and the cover window protection layer 210 to bond the cover window 220 and the cover window protection layer 210 to each other, and a second bonding member 252 may be disposed between the cover window 220 and the impact absorbing layer 225 to bond the cover window 220 and the impact absorbing layer 225 to each other. In an embodiment, a third bonding member 253 may be disposed between the impact absorbing layer 225 and the polarization member 230 to bond the impact absorbing layer 225 and the polarization member 230 to each other, and a fourth bonding member 254 may be disposed between the polarization member 230 and the display panel 100 to bond the polarization member 230 and the display panel 100 to each other.

In an embodiment, in the upper bonding members 251, 252, 253, and 254 which are members for attaching the layers on one surface of the display panel 100, the first bonding member 251 may be a protection layer bonding member for attaching the cover window protection layer 210, the second bonding member 252 may be a window bonding member for attaching the cover window 220, the third bonding member 253 may be an impact absorbing layer bonding member for attaching the impact absorbing layer 225, and the fourth bonding member 254 may be a polarization portion bonding member for attaching the polarization member 230. All of the upper bonding members 251, 252, 253, and 254 may be optically transparent.

The lower laminated structure 300 is disposed on the bottom surface of the display panel 100. The rear laminated structure 300 may include a polymer film layer 310 and a cover panel 320, which are sequentially laminated rearward from the display panel 100.

The polymer film layer 310 may include a polymer film. The polymer film layer 310 may include, for example, PI, PET, PC, polyethylene ("PE"), polypropylene ("PP"), polysulfone ("PSF"), PMMA, TAC, COP or the like.

The cover panel 320 may be disposed on the bottom surface of the polymer film layer 310. The cover panel 320 may include at least one functional layer. The functional layer may be a layer that performs a heat dissipation function, an electromagnetic shielding function, a grounding function, a buffering function, a rigidity enhancing function, a supporting function, a light blocking function, and/or a digitizing function. The functional layer may be a sheet layer, a film layer, a thin layer, a coating layer, a panel, a plate, or the like. The functional layer may have a single layer structure or a multilayer structure with a stack of multiple thin films or coating layers. The functional layer may be, for example, a supporting member, a heat dissipation layer, an electromagnetic shielding layer, an impact absorbing layer, a digitizer, or the like.

The lower laminated structure 300 may include lower bonding members 351 and 352 for bonding adjacently laminated members. In one embodiment, for example, a fifth bonding member 351 may be disposed between the display panel 100 and the polymer film layer 310 to bond the display panel 100 and the polymer film layer 310 to each other, and a sixth bonding member 352 may be disposed between the polymer film layer 310 and the cover panel 320 to bond the polymer film layer 310 and the cover panel 320 to each other. In an embodiment, the lower laminated structure 300 may further include a buffer member disposed between the polymer film and the cover panel 320.

The support member SM may be disposed on the bottom surface of the display module DM. In an embodiment, the support member SM may be disposed on the bottom surface of the cover panel 320 of the lower laminated structure 300. The support member SM will be described later in greater detail with reference to FIG. 6.

An elastic sheet 500 may be disposed on the bottom surface of the support member SM. The elastic sheet 500 may include or be made of an elastic material, e.g., thermoplastic polyurethane. In an embodiment, the thickness of a part of the elastic sheet 500 disposed in the folding area FA may be smaller than the thickness of a part of the elastic sheet 500 disposed in the first non-folding area NFA1 and the second non-folding area NFA2. In an embodiment, the elastic sheet 500 may have a uniform thickness.

A heat dissipation member 600 may be disposed on the bottom surface of the elastic sheet 700. In an embodiment, the heat dissipation member 600 may be disposed only in the first non-folding area NFA1 and the second non-folding area NFA2, but the disclosure is not limited thereto. The heat dissipation member 600 may be a heat dissipation sheet including a copper alloy, carbon nanotubes, graphite, or the like.

A seventh bonding member 451 may be disposed between the cover panel 320 and the support member SM to bond the cover panel 320 and the support member SM to each other. An eighth bonding member 452 may be disposed between the support member SM and the elastic sheet 500 to bond the support member SM and the elastic sheet 500 to each other. A nineth bonding member 550 may be disposed between the elastic sheet 700 and the heat dissipation member 600 to bond the elastic sheet 700 and the heat dissipation member 600 to each other. The seventh bonding member 451, the eighth bonding member 452, and the nineth bonding member 550 may be optically transparent. At least one selected from the seventh bonding member 451, the eighth bonding member 452, or the nineth bonding member 550 may include a pressure sensitive adhesive.

Hereinafter, the support member SM of the display device 1 according to an embodiment will be described in detail with reference to FIGS. 6 to 8.

Figure 6:
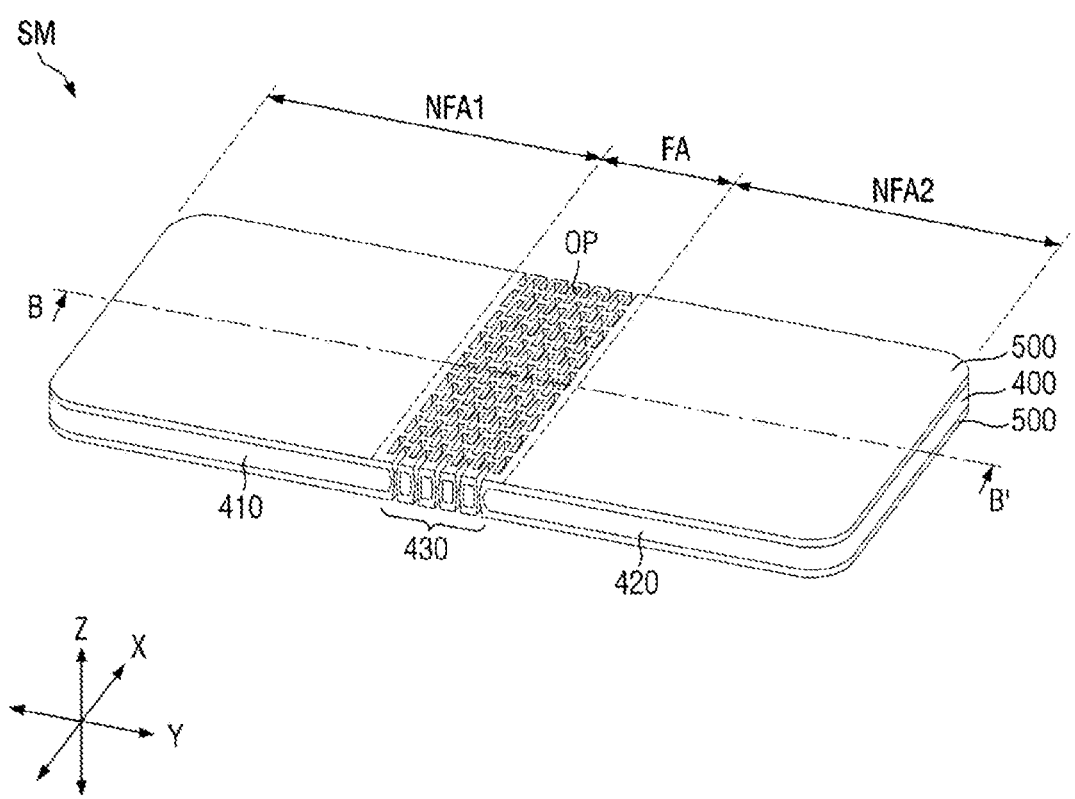
FIG. 6 is a perspective view of a support member of a display device according to an embodiment.

FIG. 6 is a perspective view of a support member of a display device according to an embodiment. FIG. 7 is a cross-sectional view taken along line B-B' of FIG. 6. FIG. 8 is an enlarged cross-sectional view of portion 'P' of FIG. 7.

Figure 8:
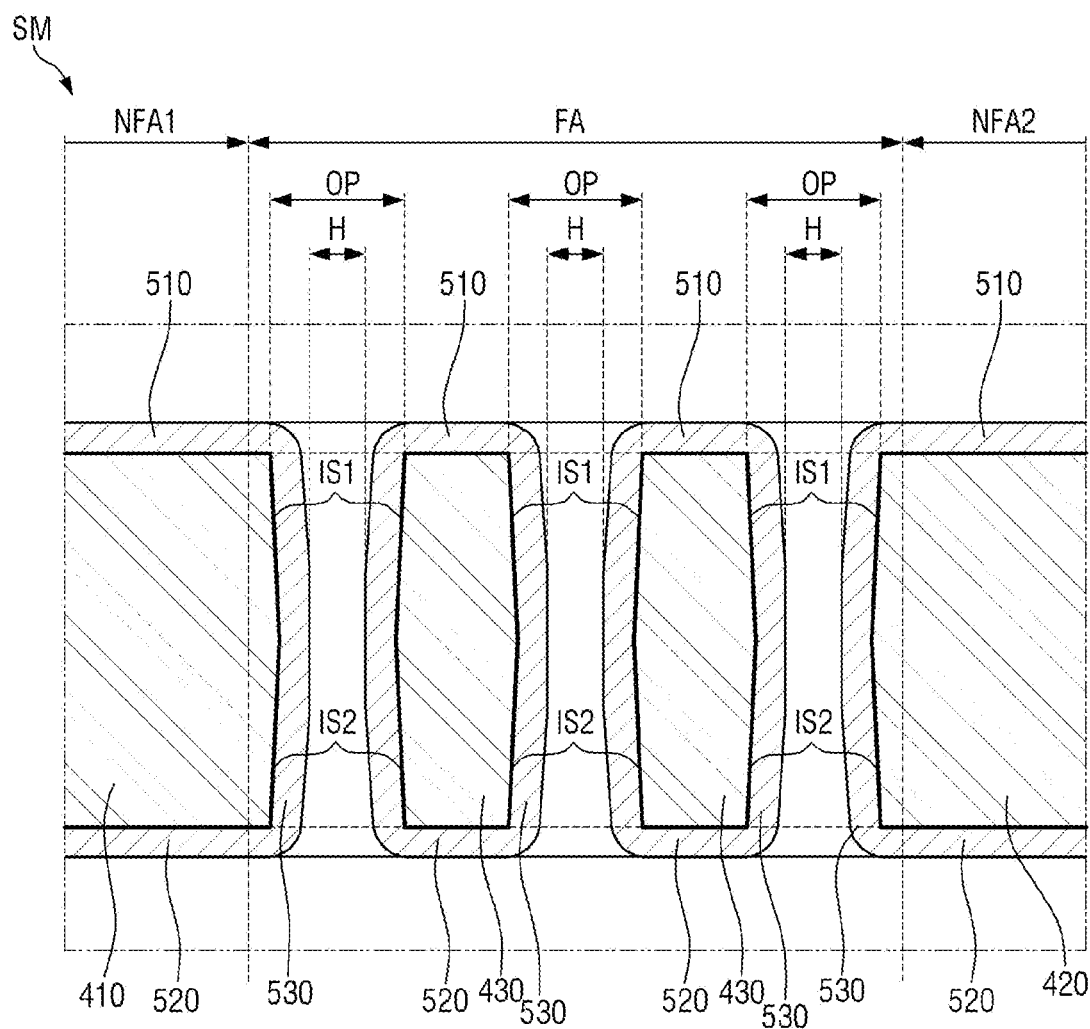
FIG. 8 is an enlarged cross-sectional view of portion 'P' of FIG. 7.

For simplicity of illustration and description, the display module DM is omitted in FIGS. 6 and 8.

Referring to FIGS. 1 to 6, as described above, the support member SM may be disposed on the bottom surface of the display module DM to support the display module DM. The bottom surface of the display module DM may be a surface opposite to the top surface of the display module DM on which display is performed.

The support member SM may be disposed over the first non-folding area NFA1, the folding area FA, and the second non-folding area NFA2. In such an embodiment, as shown in FIGS. 1 to 3, the support member SM may be folded and unfolded together with the display module DM. In such an embodiment, as will be described later, a plurality of openings OP is defined through the folding area FA of the support member SM in the thickness direction. Accordingly, a part of the support member SM disposed in the folding area FA may have flexibility and/or elasticity greater than that/those of a part of the support member SM disposed in the first non-folding area NFA1 and the second non-folding area NFA2. Alternatively, a part of the support member SM disposed in the folding area FA may have a flexural rigidity less than that of a part of the support member SM disposed in the first non-folding area NFA1 and the second non-folding area NFA2.

The support member SM may include a support plate 400 and a coating layer 500 coated on the support plate 400.

The support plate 400 may have a thin plate shape. The support plate 400 may have a rectangular shape in a plan view. In one embodiment, for example, the support plate 400 may include both short sides in the first direction X and both long sides in the second direction Y, but the disclosure is not limited thereto. In an alternative embodiment, the support plate 400 may have one of various shapes such as a polygonal shape, a circular shape, an elliptical shape, and the like.

The support plate 400 may include a metal. In one embodiment, for example, the support plate 400 may be a metal plate. The metal may include iron, nickel, and an alloy thereof. In one embodiment, for example, the metal may be Invar.

Figure 7:
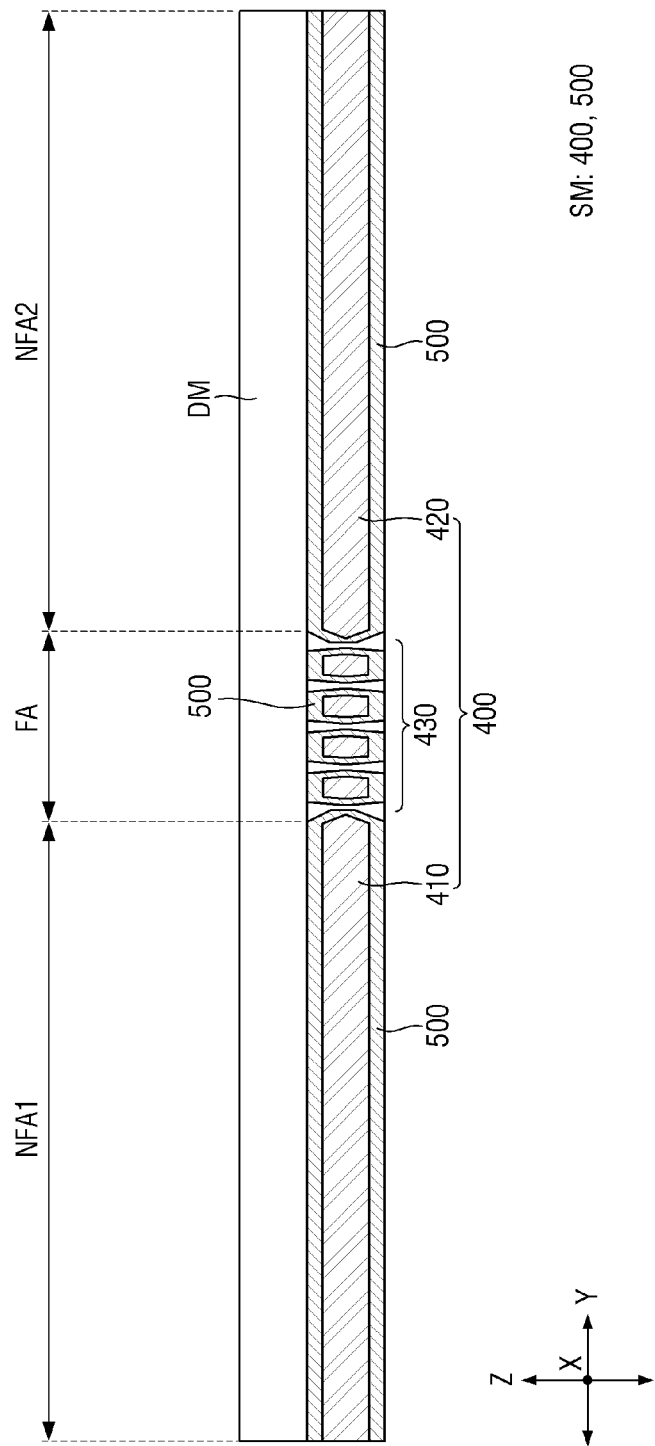
FIG. 7 is a cross-sectional view taken along line B-B' of FIG. 6.

Referring further to FIG. 7, the support plate 400 may include a first support portion 410, a second support portion 420, and a flexible portion 430.

The first support portion 410 and the second support portion 420 may be disposed in the first non-folding area NFA1 and the second non-folding area NFA2, respectively. The first support portion 410 and the second support portion 420 may support the bottom surface of the display module DM disposed in the first non-folding area NFA1 and the second non-folding area NFA2, respectively. The first support portion 410 and the second support portion 420 may be disposed only in the first non-folding area NFA1 and the second non-folding area NFA2, respectively, or a part of the first support portion 410 and/or the second support portion 420 may be disposed across the folding area FA. The first support portion 410 and the second support portion 420 may have a flat plate shape without the openings OP. In an embodiment, at least one functional hole, such as a sensor hole or a camera hole may be further defined through the first support portion 410 or the second support portion 420.

The flexible portion 430 may be disposed between the first support portion 410 and the second support portion 420. The flexible portion 430 may be disposed in the folding area FA. A part of the flexible portion 430 may be further disposed in the first non-folding area NFA1 and/or the second non-folding area NFA2. The flexible portion 430 may support the bottom surface of the display module DM disposed in the folding area FA. One side of the flexible portion 430 may be connected to the first support portion 410, and an opposing side of the flexible portion 430 may be connected to the second support portion 420.

In an embodiment, the plurality of openings OP is defined in the flexible portion 430. The plurality of openings OP may be defined through the flexible portion 430 from the top surface to the bottom surface of the flexible portion 430 in the thickness direction. In such an embodiment, the plurality of openings OP may extend from the top surface to the bottom surface, through the portion between the top surface and the bottom surface of the flexible portion 430.

The plurality of openings OP may be arranged to form a grid pattern in the flexible portion 430. In one embodiment, for example, each of the plurality of openings OP may have a slit shape elongated in the first direction X. However, the number, the shape, and the arrangement of the plurality of openings OP are not limited thereto. The opening OP may mean a hole H (shown in FIG. 8).

Since the plurality of openings OP are defined or formed in the flexible portion 430, the flexible portion 430 may have flexibility and/or elasticity greater than those of the first support portion 410 and the second support portion 420. The flexible portion 430 may have a flexural rigidity less than those of the first support portion 410 and the second support portion 420.

The flexible portion 430 may be extended and contracted as the display device 1 is folded or unfolded. In one embodiment, for example, when the display device 1 is folded as shown in FIG. 2 or 3, the flexible portion 430 may be bent and extended by the bending of the folding area FA of the display device 1. In such an embodiment, when the display device 1 is unfolded as shown in FIG. 1, the flexible portion 430 may be unfolded to be flat and contracted.

The coating layer 500 may be disposed on the support plate 400 to coat the support plate 400. The coating layer 500 may be disposed directly on the support plate 400. The coating layer 500 may be disposed on the top surface and the bottom surface of the support plate 400 and in the plurality of openings OP. In such an embodiment, a part of the coating layer 500 may be disposed in the plurality of openings OP to fill at least a part of the plurality of openings OP.

A part of the coating layer 500 that coats the top surface of the support plate 400 and a part of the coating layer 500 that coats the bottom surface of the support plate 400 may be connected in each of the plurality of openings OP. In one embodiment, for example, the side surfaces of the first support portion 410 and the second support portion 420 disposed along the circumference of the support plate 400 may be exposed to the outside, but the disclosure is not limited thereto. In an embodiment, the side surfaces of the first support portion 410 and the second support portion 420 may be covered by the coating layer 500.

The coating layer 500 may include or be made of, e.g., PI or resin having a property similar to that of PI. The coating layer 500 may include thermosetting PI. In an embodiment, the coating layer 500 may include phenolic resin, urea resin, melamine resin, unsaturated polyester resin, epoxy resin or polyurethane resin. The coating layer 500 may have a Young's modulus in a range of about 2.0 gigapascals (GPa) to 5.0 GPa. The Young's modulus may mean an elastic modulus. In an embodiment, the coating layer 500 may include or be made of high modulus polyimide having a Young's modulus of about 3.0 GPa or higher.

Referring further to FIG. 8, the plurality of openings OP may include inner spaces extending in the thickness direction such that the flexible portion 430 may include inner peripheral surfaces IS surrounding the inner spaces. Since one sides of the inner peripheral surfaces IS are connected to the top surface of the support plate 400 and an opposing sides of the inner peripheral surfaces IS are connected to the bottom surface of the support plate 400 in cross-sectional view, the inner peripheral surfaces IS may mean the side surfaces of the flexible portion 430 that form or define the inner spaces of the plurality of openings OP.

The inner peripheral surfaces IS defining the plurality of openings OP may be disposed to be inclined in the thickness direction. The thickness direction may be a direction perpendicular to the extension direction of the top surface and/or the bottom surface of the support plate 400 in cross-sectional view. In such an embodiment, the inner peripheral surfaces IS defining the plurality of openings OP may be disposed to be inclined with respect to the top surface and/or the bottom surface of the support plate 400. The inner peripheral surface IS defining the plurality of openings OP may include a first inclined surface IS1 and a second inclined surface IS2.

The first inclined surface IS1 and the second inclined surface IS2 may connect the top surface and the bottom surface of the support plate 400. In such an embodiment, one side of the first inclined surface IS1 may be connected to the top surface of the support plate 400. One side of the second inclined surface IS2 may be connected to the bottom surface of the support plate 400, and an opposing side of the second inclined surface IS2 may be connected to the opposing side of the first inclined surface IS1. In an embodiment, the first inclined surface IS1 and the second inclined surface IS2 may be flat surfaces. In an alternative embodiment, the first inclined surface IS1 and the second inclined surface IS2 may have curved surfaces. In an embodiment, the first inclined surface IS1 and the second inclined surface IS2 may include fine irregularities. The irregularities may be formed during an etching process.

The first inclined surface IS1 and the second inclined surface IS2 may be inclined in a way such that the width of the opening OP changes depending on the depth of the opening OP. The width of the opening OP may include a width in the first direction X and a width in the second direction Y. The depth of the opening OP may be a depth measured in the third direction Z from the top surface or the bottom surface of the support plate 400.

The first inclined surface IS1 and the second inclined surface IS2 may be inclined in a way such that the width of the opening OP becomes smaller toward the intermediate portion of the opening OP in cross-sectional view. The intermediate portion of the opening OP may be a central portion between one end that is disposed on the top surface of the support plate 400 and opened upward and the other end that is disposed on the bottom surface of the support plate 400 and opened downward. In such an embodiment, the first inclined surface IS1 and the second inclined surface IS2 may be arranged in a way such that the width of the central portion between one end and the other end of the opening OP becomes smaller than the width of one end and/or the other end of the opening OP in cross-sectional view. Accordingly, the inner peripheral surface IS defining the opening OP may protrude in the first or second direction X or Y toward the central portion of the inner space of the opening OP in a way such that the central portion of the inner space of the opening OP becomes narrower in cross-sectional view.

In an embodiment, the inner peripheral surface IS defining the plurality of openings OP may include two or more inclined surfaces. In an embodiment, the inner peripheral surface IS defining the plurality of openings OP may further include a vertical surface substantially parallel to the thickness direction or the third direction Z.

The coating layer 500 may include a first coating layer 510, a second coating layer 520, and a third coating layer 530.

The first coating layer 510 may be disposed directly on the top surface of the support plate 400 to coat the top surface of the support plate 400. In such an embodiment, the first coating layer 510 may be disposed to cover the top surfaces of the first support portion 410, the flexible portion 430, and the second support portion 420. In such an embodiment, as shown in FIG. 6, the portions of the first coating layer 510 disposed on the top surfaces of the first support portion 410, the flexible portion 430, and the second support portion 420 may be integrally connected. In an embodiment, the first coating layer 510 is disposed on the other area of the top surface of the support plate 400 where the plurality of openings OP are not formed, so that one ends of the plurality of openings OP may be exposed upward.

The second coating layer 520 may be disposed directly on the bottom surface of the support plate 400 to directly coat the bottom surface of the support plate 400. In such an embodiment, the second coating layer 520 may be disposed to cover the bottom surfaces of the first support portion 410, the flexible portion 430, and the second support portion 420. In such an embodiment, the portions of the second coating layer 520 disposed on the bottom surfaces of the first support portion 410, the flexible portion 430, and the second support portion 420 may be integrally connected. In an embodiment, the second coating layer 520 is disposed on the other area of the bottom surface of the support plate 400 where the plurality of openings OP are not formed, so that the other ends of the plurality of openings OP may be exposed downward.

The third coating layer 530 may be disposed in the plurality of openings OP. The third coating layer 530 may be disposed directly on the inner peripheral surfaces IS defining the plurality of openings OP to coat the inner peripheral surfaces IS. The third coating layer 530 may be disposed to completely cover the inner peripheral surfaces IS defining the plurality of openings OP, and the first coating layer 510 and the second coating layer 520 may be connected by the third coating layer 530. In an embodiment, the third coating layer 530 may be disposed to form or define a plurality of holes H respectively penetrating the plurality of openings OP in the thickness direction. In such an embodiment, the thickness of the third coating layer 530 may be less than a half of the minimum width of the plurality of openings OP.

The width of the hole H formed by the third coating layer 530 may be smaller than the width of the opening OP. The width of the hole H may become smaller toward the central portion of the hole H in cross sectional view. In an embodiment, the width of one end of the hole H opened toward the top surface of the support plate 400 and/or the first coating layer 510 and the other end of the hole H opened toward the bottom surface of the support plate 400 and/or the second coating layer 520 may be greater than the width of the central portion of the hole H between one end and the other end of the hole H.

In an embodiment, the thicknesses of the first coating layer 510, the second coating layer 520, and the third coating layer 530 may be reduced toward the boundaries therebetween. In an alternative embodiment, the first coating layer 510, the second coating layer 520, and the third coating layer 530 may be arranged to have a constant thickness.

The first coating layer 510, the second coating layer 520, and the third coating layer 530 may be arranged in a way such that the surfaces of the portion where the first coating layer 510 and the third coating layer 530 are connected to each other and the portion where the second coating layer 520 and the third coating layer 530 are connected to each other have an outwardly convex curvature. Accordingly, the surfaces of the portion where the first coating layer 510 and the third coating layer 530 are connected and the portion where the second coating layer 520 and the third coating layer 530 are connected to each other may have a rounded shape in cross-sectional view. In an embodiment, the surfaces of the portion where the first coating layer 510 and the third coating layer 530 are connected to each other and the portion where the second coating layer 520 and the third coating layer 530 are connected to each other may have an angled shape.

In an embodiment, the first coating layer 510, the second coating layer 520, and the third coating layer 530 may include or be made of a material having a same property, e.g., PI having a same property. In an embodiment, at least one selected from the first coating layer 510, the second coating layer 520, and the third coating layer 530 may include or be made of a material having different properties from those of another coating layer, e.g., PI whose coefficient of thermal expansion or Young's modulus is different from those of another coating layer. In an embodiment, the coating layer 500 may be divided into the first coating layer 510, the second coating layer 520, and the third coating layer 530 depending on positions, but the disclosure is not limited thereto. In an embodiment, the first coating layer 510, the second coating layer 520, and the third coating layer 530 may be defined by portions or areas of a coating layer 500 integrally formed as a single unitary unit.

In an embodiment of the support member SM of the display device 1 according to the invention, the support plate 400 is coated with the coating layer 500, so that cracks generated by repeated folding, particularly bidirectional folding, may be repaired and the cracks may be effectively prevented from propagating. Accordingly, the durability of the flexible portion 430 of the support plate 400 against fatigue fracture may be substantially improved. In such an embodiment, due to the inclination of the inner peripheral surfaces IS defining the plurality of openings OP, the inner peripheral surfaces IS defining the plurality of openings OP as well as the top surface and the bottom surface of the support plate 400 may be further coated with the coating layer 500, and the portions of the coating layer 500 on the top surface and the bottom surface of the support plate 400 and the inner peripheral surfaces IS defining the plurality of openings OP may be integrally connected to each other. Accordingly, the durability of the flexible portion 430 of the support plate 400 may be further improved compared to the case where only the top surface and the bottom surface of the support plate 400 are coated with the coating layer 500.

Figure 9:
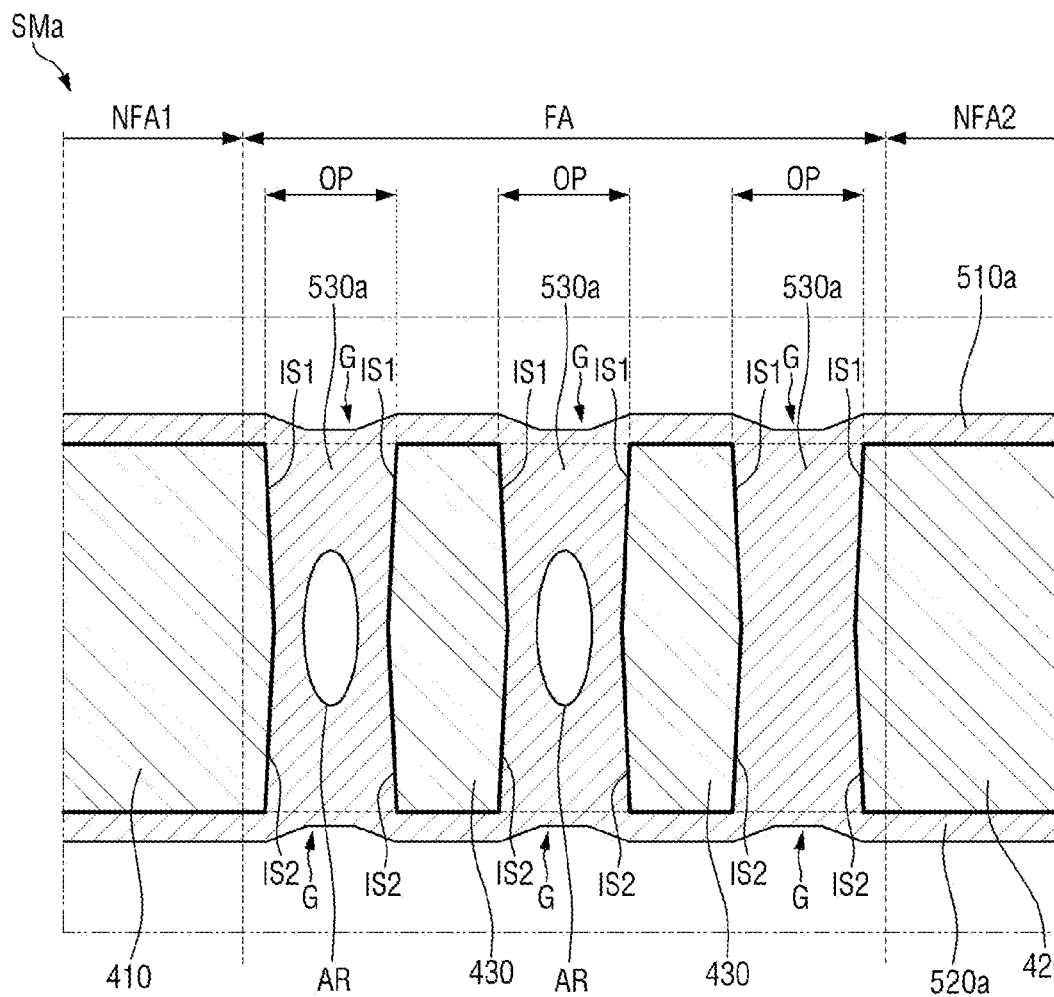
FIG. 9 is a cross-sectional view of a support member of a display device according to an alternative embodiment.

FIG. 9 is a cross-sectional view of a support member of a display device according to an alternative embodiment.

The embodiment of the support member SMa shown in FIG. 9 is substantially the same as the embodiment of the support member SM shown in FIG. 8 except that a third coating layer 530*a* fills the plurality of openings OP without forming holes in the plurality of openings OP. The same or like elements shown in FIG. 9 have been labeled with the same reference characters as used above to describe the embodiment of the support member SM shown in FIG. 8, and any repetitive detailed description thereof will hereinafter be omitted or simplified.

Referring to FIG. 9, in such an embodiment, a coating layer 500*a* may be disposed to block the plurality of openings OP. In such an embodiment, the third coating layer 530*a* may be disposed to fill the inner spaces of the plurality of openings OP. In such an embodiment, unlike the case of FIG. 8, the third coating layer 530*a* may be disposed in the opening OP in a way such that holes H are not formed in the plurality of openings OP. Accordingly, the plurality of openings OP may be blocked by the third coating layer 530*a*. The third coating layer 530*a* may mean a coating member that is inserted into the plurality of openings OP to block the plurality of openings OP.

The first coating layer 510*a* and the second coating layer 520*a* may be arranged to completely cover both open ends of the plurality of openings OP in cross-sectional view. In such an embodiment, as shown in FIG. 9, the upper ends of the plurality of openings OP and the upper portion of the third coating layer 530*a* in each opening OP may be covered by the first coating layer 510*a*, and the lower ends of the plurality of openings OP and the lower portion of the third coating layer 530*a* in each opening OP may be covered by the second coating layer 520*a*.

In an embodiment, some of the surfaces of the first coating layer 510*a* and the second coating layer 520*a* arranged on the plurality of openings OP may include grooves G recessed toward the inner spaces of the plurality of openings OP. In an alternative embodiment, the surfaces of the first coating layer 510 and the second coating layer 520 may be flat.

The first coating layer 510*a* and the second coating layer 520*a* may be connected by the third coating layer 530*a*. In such an embodiment, the first coating layer 510*a*, the second coating layer 520*a*, and the third coating layer 530*a* may be arranged to be integrally connected to each other.

The third coating layer 530*a* may be disposed to fill at least a part of the inner spaces of the plurality of openings OP. In one embodiment, for example, as shown on the right side of FIG. 9, the third coating layer 530*a* may be disposed to completely fill the inner spaces of the plurality of openings OP. In on alternative embodiment, for example, as shown on the left side of FIG. 9, at least one pore AR is formed or defined in the third coating layer 530*a* disposed in the inner space of each of the plurality of openings OP. The flexural rigidity of the flexible portion 430 may be appropriately adjusted by the at least one pore AR. In one embodiment, for example, at least one pore AR may prevent the flexural rigidity of the flexible portion 430 from being excessively increased by the coating of the coating layer 500*a*.

Figure 10:
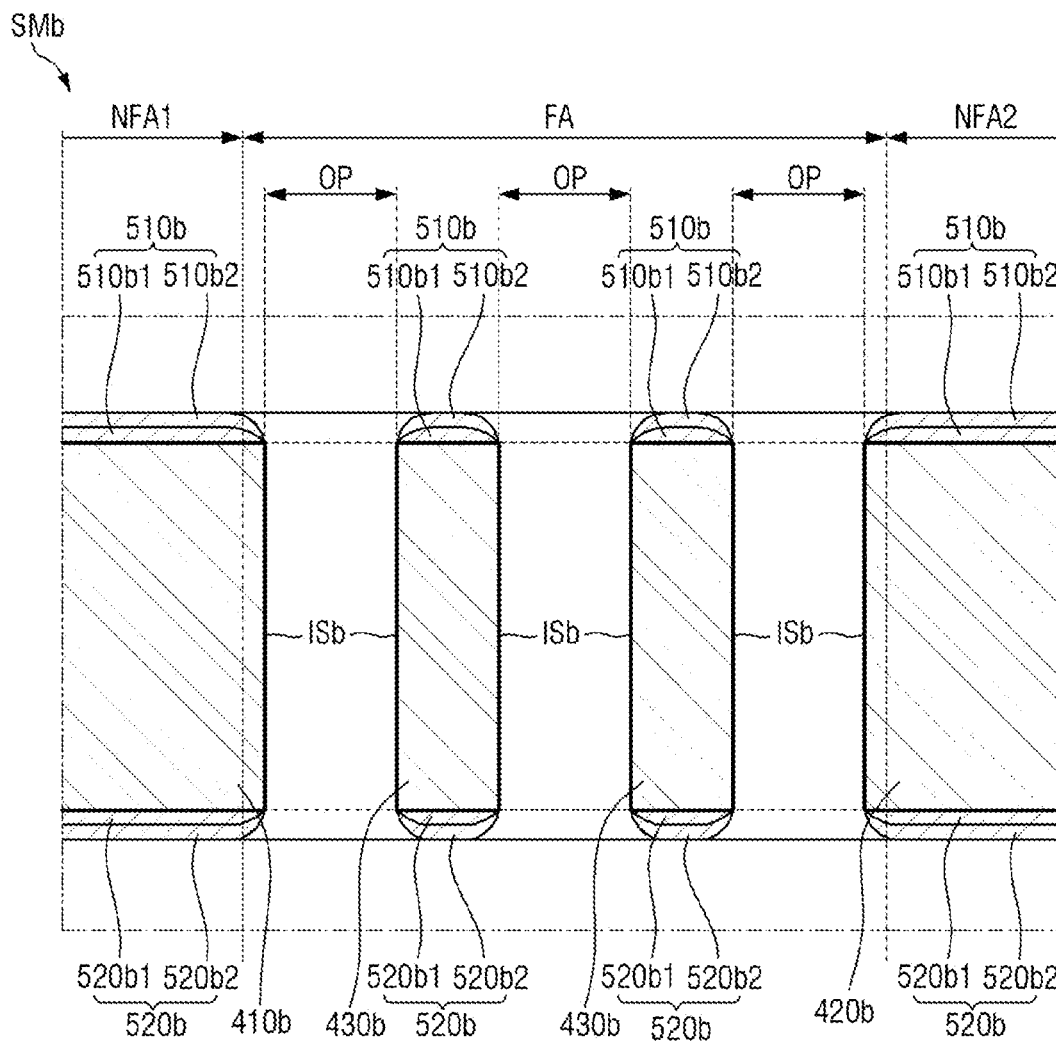
FIG. 10 is a cross-sectional view of a support member of a display device according to another alternative embodiment.

FIG. 10 is a cross-sectional view of a support member of a display device according to another alternative embodiment.

The embodiment of the support member SMb shown in FIG. 10 is substantially the same as the embodiment of the support member SM shown in FIG. 8 except that the third coating layer 530*b* is omitted and the first coating layer 510*b* and the second coating layer 520*b* have a double layer structure. The same or like elements shown in FIG. 10 have been labeled with the same reference characters as used above to describe the embodiment of the support member SM shown in FIG. 8, and any repetitive detailed description thereof will hereinafter be omitted or simplified.

Referring to FIG. 10, in such an embodiment, the inner peripheral surfaces ISb of the plurality of openings OP do not include inclined surfaces and may extend in parallel to the thickness direction. The inner peripheral surfaces ISb of the plurality of openings OP may be perpendicular to the top surface and/or the bottom surface of a support plate 400*b*. In such an embodiment, the third coating layer 530*b* may be omitted. In an alternative embodiment, the third coating layer 530*b* may be disposed on the inner peripheral surfaces ISb of the plurality of openings OP perpendicular to the top surface and/or the bottom surface of the support plate 400*b* to connect the first coating layer 510*b* to the second coating layer 520*b*.

A coating layer 500*b* may include the first coating layer 510*b* disposed on the top surface of the support plate 400*b* and the second coating layer 520*b* disposed on the bottom surface of the support plate 400*b*. Each of the first coating layer 510*b* and the second coating layer 520*b* may include two or more layers.

The first coating layer 510*b* and the second coating layer 520*b* may include anti-peeling layers 510*b*1 and 520*b*1 and high modulus layers 510*b*2 and 520*b*2, respectively.

The anti-peeling layers 510*b*1 and 520*b*1 may be disposed directly on the support plate 400*b*. The anti-peeling layers 510*b*1 and 520*b*1 may be disposed across a first support portion 410b, a flexible portion 430b, and a second support portion 420b. In some embodiments, the anti-peeling layer 510b1 and 520b1 may be disposed only in the flexible portion 430b. The anti-peeling layers 510b1 and 520b1 may have a function of preventing the coating layer 500b from being peeled off.

The coefficients of thermal expansion of the anti-peeling layers 510b1 and 520b1 may be the same as or similar to that of the support plate 400b. In one embodiment, for example, the coefficients of thermal expansion of the anti-peeling layers 510b1 and 520b1 may be in a range of about 0.8 to about 1.2 times the coefficient of thermal expansion of the support plate 400b. In one embodiment, for example, the coefficients of thermal expansion of the anti-peeling layers 510b1 and 520b1 may be about $1.8 \times 10^{-6}$ centimeters per Celsius degree (cm/° C.). In one embodiment, for example, the anti-peeling layers 510b1 and 520b1 may include or be made of PI whose coefficient of thermal expansion is the same as or similar to that of the support plate 400b or may include or be made of resin having a property similar thereto. The anti-peeling layers 510b1 and 520b1 may be expanded and contracted at a rate equal or similar to that of the support plate 400b during a curing process to have a high adhesive strength with respect to the support plate 400b.

The high modulus layers 510b2 and 520b2 may be disposed on the anti-peeling layers 510b1 and 520b1, respectively. The high modulus layers 510b2 and 520b2 may be disposed directly on the anti-peeling layers 510b1 and 520b1, respectively. The high modulus layers 510b2 and 520b2 may be disposed across the first support portion 410b, the flexible portion 430b, and the second support portion 420b.

The high modulus layers 510b2 and 520b2 may have a Young's modulus higher than those of the anti-peeling layers 510b1 and 520b1. In one embodiment, for example, the high modulus layers 510b2 and 520b2 may have a Young's modulus of about 3.0 GPa or greater. In one embodiment, for example, the difference in the Young's modulus between the anti-peeling layers 510b1 and 520b1 and the high modulus layers 510b2 and 520b2 may be in a range of about 0.5 GPa to about 1.0 GPa. In one embodiment, for example, the high modulus layers 510b2 and 520b2 may include or be made of polyimide having a Young's modulus higher than that of PI forming the anti-peeling layers 510b1 and 520b1. The high modulus layers 510b2 and 520b2 may perform a function of preventing fatigue fracture of the support plate 400b and crack propagation. In an embodiment, the thicknesses of the high modulus layers 510b2 and 520b2 may be smaller than the thicknesses of the anti-peeling layers 510b1 and 520b1, but the disclosure is not limited thereto.

For simplicity of description, hereinafter, the anti-peeling layer 510b1 of the first coating layer 510b, the anti-peeling layer 520b1 of the second coating layer 520b, and the high modulus layer 510b2 of the first coating layer 510b, and the high modulus layer 520b2 of the second coating layer 520b are referred to as the first anti-peeling layer 510b1, the second anti-peeling layer 520b1, the first high modulus layer 510b2, and the second high modulus layer 520b2, respectively.

The first anti-peeling layer 510b1 and the second anti-peeling layer 520b1 may be disposed directly on the top surface and the bottom surface of the support plate 400b, respectively. The first anti-peeling layer 510b1 and the second anti-peeling layer 520b1 may be disposed in a way such that the plurality of openings OP are not covered. The thicknesses of the first anti-peeling layer 510b1 and the second anti-peeling layer 520b1 may be reduced toward the edge.

The first high modulus layer 510b2 and the second high modulus layer 520b2 may be disposed on the first anti-peeling layer 510b1 and the second anti-peeling layer 520b1, respectively. The first high modulus layer 510b2 and the second high modulus layer 520b2 may be disposed to cover the top surface of the first anti-peeling layer 510b1 and the bottom surface of the second anti-peeling layer 520b1, respectively. In an embodiment, the end portions of the first anti-peeling layer 510b1 and the second anti-peeling layer 520b1 may be covered by the first high modulus layer 510b2 and the second high modulus layer 520b2, respectively. In an embodiment, the end portions of the first anti-peeling layer 510b1 and the second anti-peeling layer 520b1 may be exposed laterally without being covered by the first high modulus layer 510b2 and the second high modulus layer 520b2, respectively.

Figure 11:
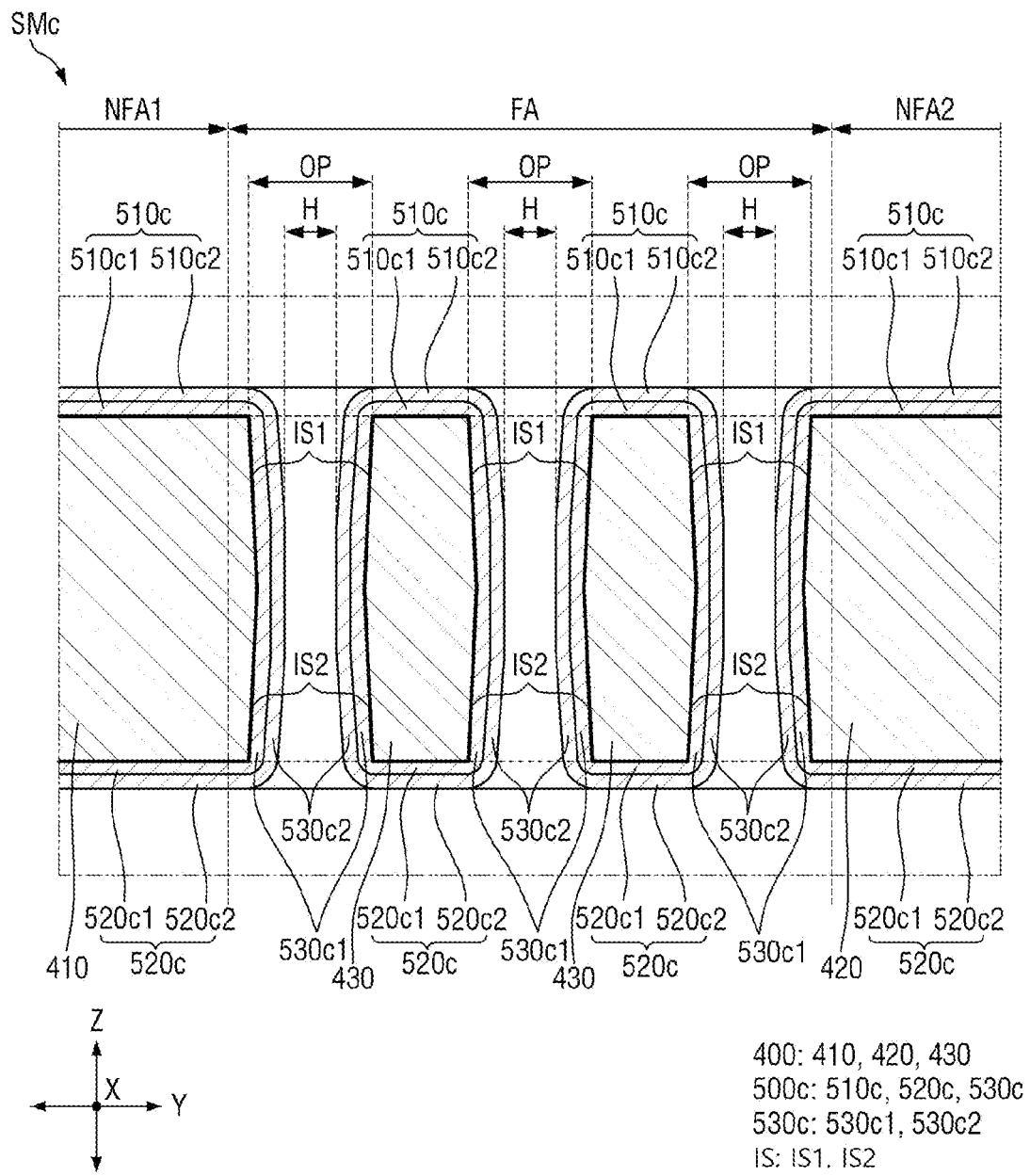
FIG. 11 is a cross-sectional view of a support member of a display device according to still another alternative embodiment.

FIG. 11 is a cross-sectional view of a support member of a display device according to still another alternative embodiment.

The embodiment of the support member SMc shown in FIG. 11 is substantially the same as the embodiment of the support member SMa shown in FIG. 10 except that a third coating layer 530c having a double layer structure is further disposed. The same or like elements shown in FIG. 11 have been labeled with the same reference characters as used above to describe the embodiment of the support member SMa shown in FIG. 10, and any repetitive detailed description thereof will hereinafter be omitted or simplified Referring to FIG. 11, in an embodiment, the inner peripheral surfaces IS defining the plurality of openings OP may include a first inclined surface IS1 and a second inclined surface IS2, and the third coating layer 530c having a double layer structure may be coated on the first inclined surface IS1 and the second inclined surface IS2. The first inclined surface IS1 and the second inclined surface IS2 may be substantially the same as or similar to those in the embodiment of FIG. 8. In an alternative embodiment, the inner peripheral surfaces IS defining the plurality of openings OP may be vertical surfaces.

A coating layer 500c may be disposed to have a double layer structure across the top surface and the bottom surface of the support plate 400 and the inner peripheral surfaces IS defining the plurality of openings OP.

The coating layer 500c may include a first coating layer 510c disposed on the top surface of the support plate 400, a second coating layer 520c disposed on the bottom surface of the support plate 400, and the third coating layer 530c disposed on the inner peripheral surfaces IS defining the plurality of openings OP.

The first coating layer 510c, the second coating layer 520c, and the third coating layer 530c may include anti-peeling layers 510c1, 520c1, and 530c1 and high modulus layers 510c2, 520c2, and 530c2, respectively.

For simplicity of description, hereinafter, the anti-peeling layer 510c1 of the first coating layer 510c, the anti-peeling layer 520c1 of the second coating layer 520c, the anti-peeling layer 530c1 of the third coating layer 530c, the high modulus layer 510c2 of the first coating layer 510c, the high modulus layer 520c2 of the second coating layer 520c, and the high modulus layer 530c2 of the third coating layer 530c are referred to as the first anti-peeling layer 510c1, the second anti-peeling layer 520c1, the third anti-peeling layer 530c1, the first high modulus layer 510c2, the second high modulus layer 520c2, and the third high modulus layer 530c2, respectively.

The first anti-peeling layer 510c1, the second anti-peeling layer 520c1, the first high modulus layer 510c2, and the second high modulus layer 520c2 may be substantially the same as or similar to the first anti-peeling layer 510b1, the second anti-peeling layer 520b1, the first high modulus layer 510b2, and the second high modulus layer 520b2 of FIG. 10.

The third anti-peeling layer 530c1 may be disposed directly on the inner peripheral surfaces IS defining the plurality of openings OP. The inner surfaces defining the plurality of openings OP may be completely covered by the third anti-peeling layer 530c1. The third anti-peeling layer 530c1 may connect the first anti-peeling layer 510c1 to the second anti-peeling layer 520c1. The first anti-peeling layer 510c1, the second anti-peeling layer 520c1, and the third anti-peeling layer 530c1 may include or be made of a same material and may be integrally connected to each other.

The third high modulus layer 530c2 may be disposed on the third anti-peeling layer 530c1. The third high modulus layer 530c2 may be disposed to completely cover the third anti-peeling layer 530c1.

The third high modulus layer 530c2 may connect the first high modulus layer 510c2 to the second high modulus layer 520c2. The first high modulus layer 510c2, the second high modulus layer 520c2, and the third high modulus layer 530c2 may be made of the same material and may be connected integrally.

The third anti-peeling layer 530c1 and the third high modulus layer 530c2 may be disposed such that holes H whose widths are smaller than those of the plurality of openings OP are formed or defined in the plurality of openings OP. The holes H may be disposed to penetrate the coating layer 500c disposed in the inner spaces of the plurality of openings OP in the thickness direction. In such an embodiment, the total thickness of the third anti-peeling layer 530c1 and the third high modulus layer 530c2 may be smaller than a half of the minimum width of the opening OP.

Figure 12:
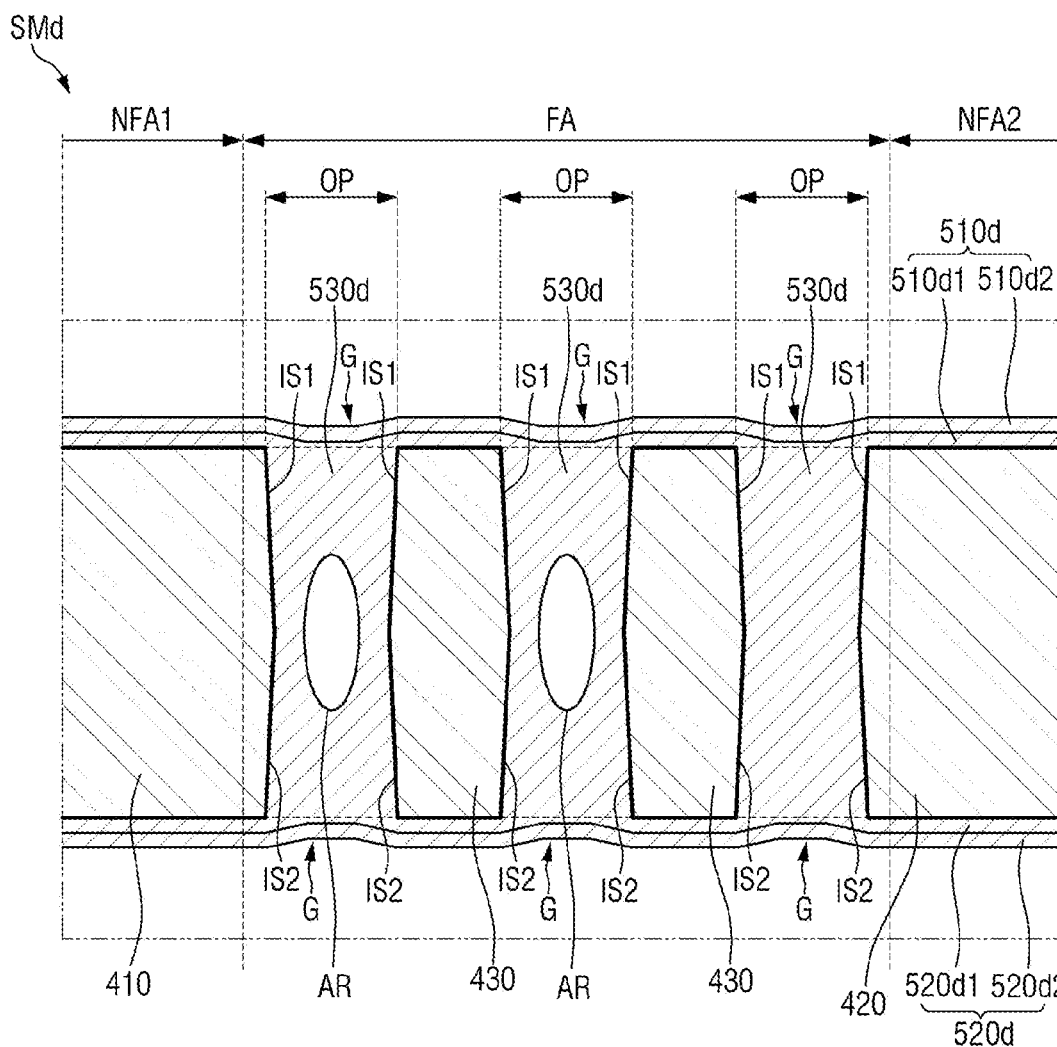
FIG. 12 is a cross-sectional view of a support member of a display device according to still another alternative embodiment.

FIG. 12 is a cross-sectional view of a support member of a display device according to still another alternative embodiment.

The embodiment of the support member SMd shown in FIG. 12 is substantially the same as the embodiment of the support member SMb shown in FIG. 10 except that a coating layer 500d is formed such that a plurality of openings OP are completely filled or pores are formed in the plurality of openings OP. The same or like elements shown in FIG. 12 have been labeled with the same reference characters as used above to describe the embodiment of the support member SMb shown in FIG. 10, and any repetitive detailed description thereof will hereinafter be omitted or simplified.

Referring to FIG. 12, in an embodiment, a first coating layer 510d and a second coating layer 520d may have a double layer structure, similarly to the embodiment of FIG. 10.

The first coating layer 510d may include a first anti-peeling layer 510d1 and a first high modulus layer 510d2, and the second coating layer 520d may include a second anti-peeling layer 520d1 and a second high modulus layer 520d2.

The first anti-peeling layer 510d1 and the second anti-peeling layer 520d1 may be disposed on the top surface and the bottom surface of the support plate 400, respectively, to cover both open ends of the plurality of openings OP.

The first high modulus layer 510d2 and the second high modulus layer 520d2 may be disposed on the top surface of the first anti-peeling layer 510d1 and on the bottom surface of the second anti-peeling layer 520d1, respectively. In such an embodiment, the surfaces of the first anti-peeling layer 510d1, the second anti-peeling layer 520d1, the first high modulus layer 510d2, and the second high module layer 520d2 disposed at the upper portions or the lower portions of the plurality of openings OP may include grooves G recessed toward the inner spaces of the plurality of openings OP, but the disclosure is not limited thereto.

The third coating layer 530d may fill the inner spaces of the plurality of openings OP. In one embodiment, for example, as shown on the left side of FIG. 12, the third coating layer 530d may be disposed to form pores AR in the inner spaces of the openings OP. In one embodiment, for example, as shown on the right side of FIG. 12, the third coating layer 530d may be disposed to completely fill the inner spaces of the openings OP. The third coating layer 530d may mean a member that fills the inner spaces of the plurality of openings OP.

The third coating layer 530d may connect the first anti-peeling layer 510d1 to the second anti-peeling layer 520d1. In such an embodiment, the upper portion of the third coating layer 530d may be connected to the first anti-peeling layer 510d1, and the lower portion of the third coating layer 530d may be connected to the second anti-peeling layer 520d1.

The first anti-peeling layer 510d1, the second anti-peeling layer 520d1, and the third coating layer 530d may include or be made of a same material and may be integrally connected. In such an embodiment, the third coating layer 530d may include or be made of a material whose coefficient of thermal expansion is the same as or similar to that of the support plate 400.

In an embodiment, as described above with reference to FIG. 11, the third coating layer 530d may include a third anti-peeling layer and a third high modulus layer, and the third high modulus layer may be formed or disposed in a way such that the inner spaces of the plurality of openings OP are completely filled or pores AR are formed or defined in the inner spaces of the plurality of openings OP.

Figure 13:
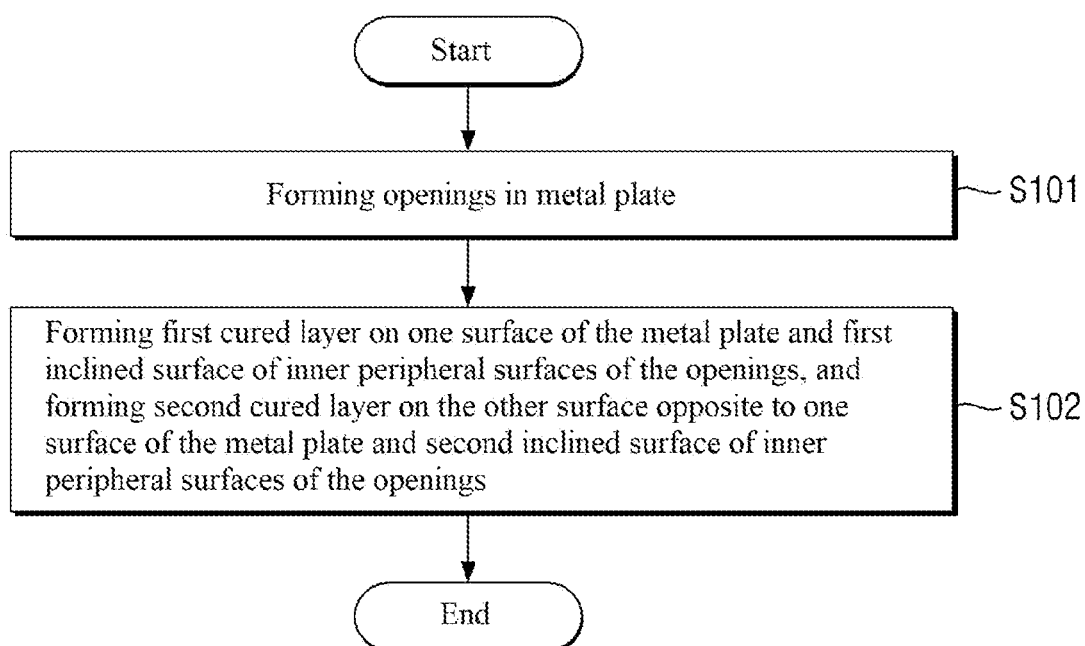
FIG. 13 is a flowchart of a method of manufacturing a display device according to an embodiment.

FIG. 13 is a flowchart of a method of manufacturing a display device according to an embodiment. FIGS. 14 to 19 are diagrams conceptually illustrating processes in a method of manufacturing a display device according to an embodiment.

The display device manufactured by such an embodiment of the method of manufacturing a display device may be the display device 1 of FIG. 1, but is not limited thereto. An embodiment of the method of manufacturing a display device may include the method of manufacturing the support member SM of FIGS. 1 to 12.

A support plate 400', an opening OP', an inner peripheral surface IS', a first inclined surface IS1', and a second inclined surface IS2' to be described below may be the support plate 400, the opening OP, the inner peripheral surface IS, the first inclined surface IS1, and the second inclined surface IS2, respectively. Further, the coating layer 500 of FIG. 8 may be formed by a first cured layer CL1 and a second cured layer CL2 to be described below.

Referring to FIG. 13, an embodiment of the method of manufacturing a display device may include a process (S101) of forming the plurality of openings OP' in the support plate 400' and a process (S102) of forming the first cured layer CL1 on one surface of the support plate 400' and the first inclined surface IS1' of the inner peripheral surfaces IS' defining the plurality of openings OP' and forming the second cured layer CL2 on the opposing surface opposite to one surface of the support plate 400' and the second inclined surface IS2' of the inner peripheral surfaces IS' defining the plurality of openings OP'.

The first cured layer CL1 and the second cured layer CL2 may be connected to each other in the plurality of openings OP' to cover the inner peripheral surfaces IS' of the plurality defining openings OP'.

In one embodiment, for example, the first cured layer CL1 and the second cured layer CL2 may be formed sequentially. In an alternative embodiment, the first cured layer CL1 and the second cured layer CL2 may be formed at the same time.

The process (S102) of forming the first cured layer CL1 and the second cured layer CL2 may include adjusting the curing time of the first cured layer CL1 and the second cured layer CL2 in a way such that holes H are formed in the plurality of openings OP'.

The process (S102) of forming the first cured layer CL1 and the second cured layer CL2 may include adjusting the curing time of the first cured layer CL1 and the second cured layer CL2 in a way such that the plurality of openings OP' are blocked.

The process (S102) of forming the first cured layer CL1 and the second cured layer CL2 may include adjusting the curing time of the first cured layer CL1 and the second cured layer CL2 in a way such that pores are formed in the plurality of openings OP'.

Only some embodiments of the method of manufacturing a display device is described above. In such embodiment, at least a part of the above-described processes may be omitted, or at least one or more other processes may be further included with reference to the embodiments of FIGS. 1 to 12 and 14 to 20.

Hereinafter, a method of manufacturing a display device according to an embodiment will be described in detail with reference to FIGS. 14 to 19.

Figure 14:
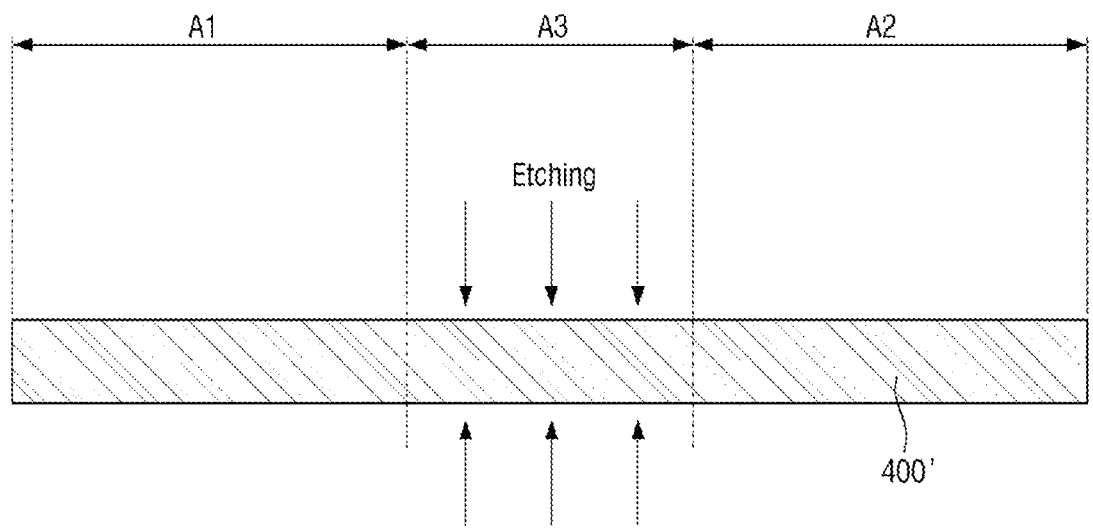
FIGS. 14 to 19 are diagrams conceptually illustrating steps in a method of manufacturing a display device according to an embodiment.
Figure 15:
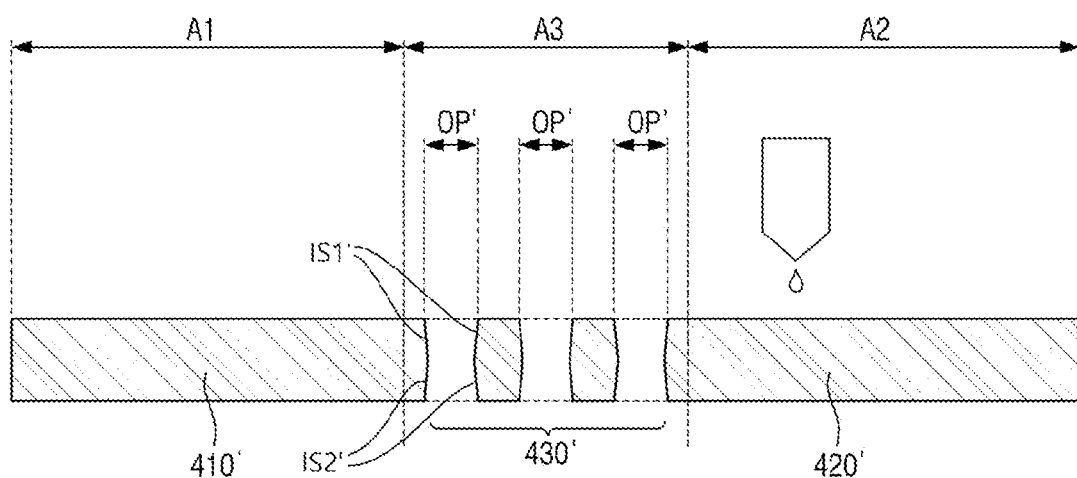

Referring to FIGS. 14 and 15, the support plate 400' may be prepared. The support plate 400' may be a metal plate.

The support plate 400' may be divided into a first area A1, a second area A2, and a third area A3 disposed between the first area A1 and the second area A2. Referring to FIGS. 1 to 12, the first area A1, the second area A2, and the third area A3 may correspond to the first support portion 410 (the first non-folding area NFA1), the second support portion 420 (the second non-folding area NFA1), and the flexible portion 430 (the folding area FA) of the support plate 400, respectively.

The plurality of openings OP' may be formed by etching the third area A3 of the support plate 400'. In one embodiment, for example, the plurality of openings OP' may be formed by coating an etching resist layer on the support plate 400' and immersing the support plate 400' in an etching solution. In such an embodiment, the support plate 400' may be etched in a way such that the inner peripheral surfaces IS' defining the plurality of openings OP' are inclined by adjusting the etching rate, e.g., the etching time, of the support plate 400'.

Figure 16:
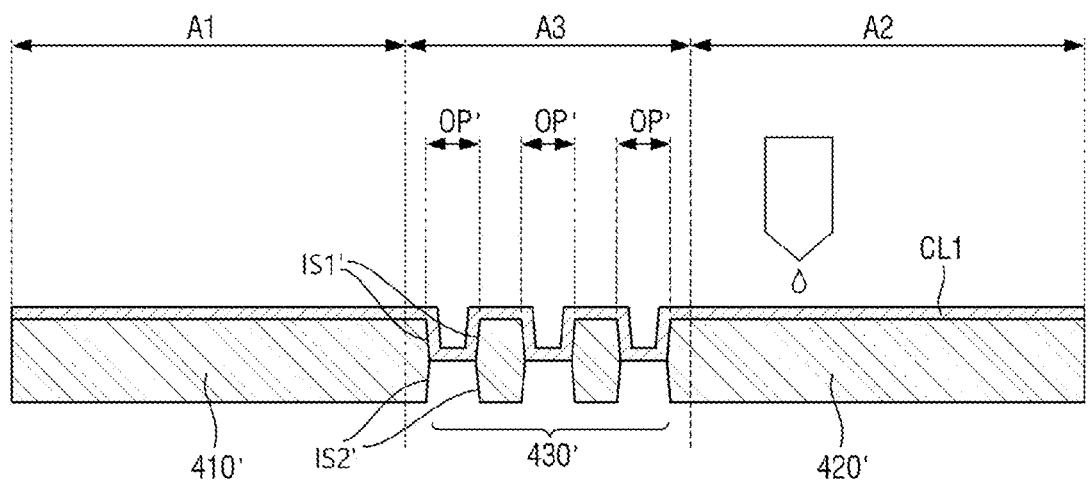

Referring to FIG. 16, after the etching process is completed, the first cured layer CL1 may be coated on one surface of the support plate 400'. The first cured layer CL1 may include thermosetting resin. In one embodiment, for example, the first cured layer CL1 may include thermosetting PI. The first cured layer CL1 may be coated on one surface of the first support portion 410', one surface of the flexible portion 430', and one surface of the second support portion 420'.

The first cured layer CL1 may be coated to cover the plurality of openings OP'. In such an embodiment, a part of the first cured layer CL1 may permeate the plurality of openings OP' to cover at least a part of the inner peripheral surfaces IS' defining the plurality of openings OP'. In an embodiment, a part of the first cured layer CL1 may cover about a half of the inner peripheral surfaces IS' of the openings OP', but the disclosure is not limited thereto. Alternatively, the first cured layer CL1 may flow along the inner peripheral surfaces IS' of the openings OP' and completely fill the inner spaces of the openings OP', or may completely cover the inner peripheral surfaces IS' of the openings OP'.

Figure 17:
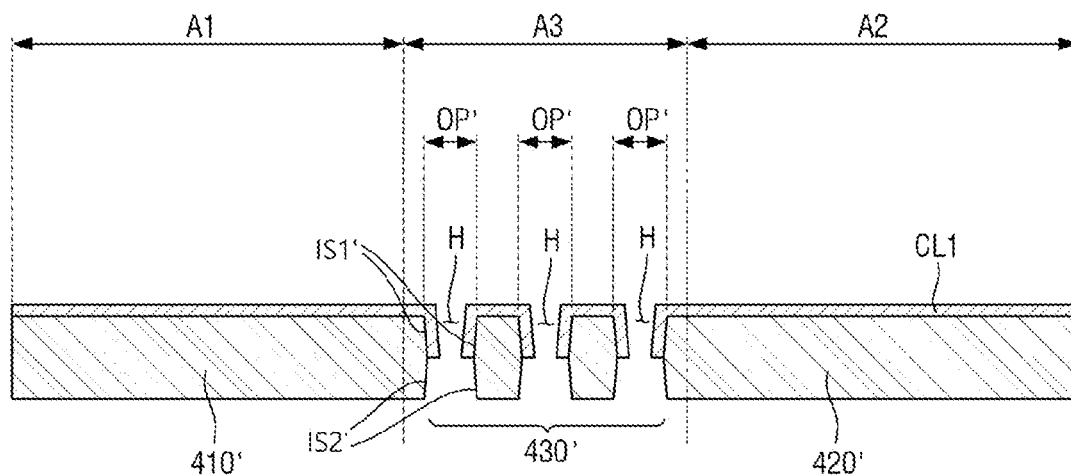

Referring to FIG. 17, the first cured layer CL1 may be thermally cured after the first cured layer CL1 is coated. In an embodiment, as the solvent in the first cured layer CL1 evaporates, a plurality of holes H may be formed in the first cured layer CL1 coated on the flexible portion 430' of the support plate 400'. The curing time of the first cured layer CL1 may be adjusted to be enough to form the plurality of holes H.

Figure 18:
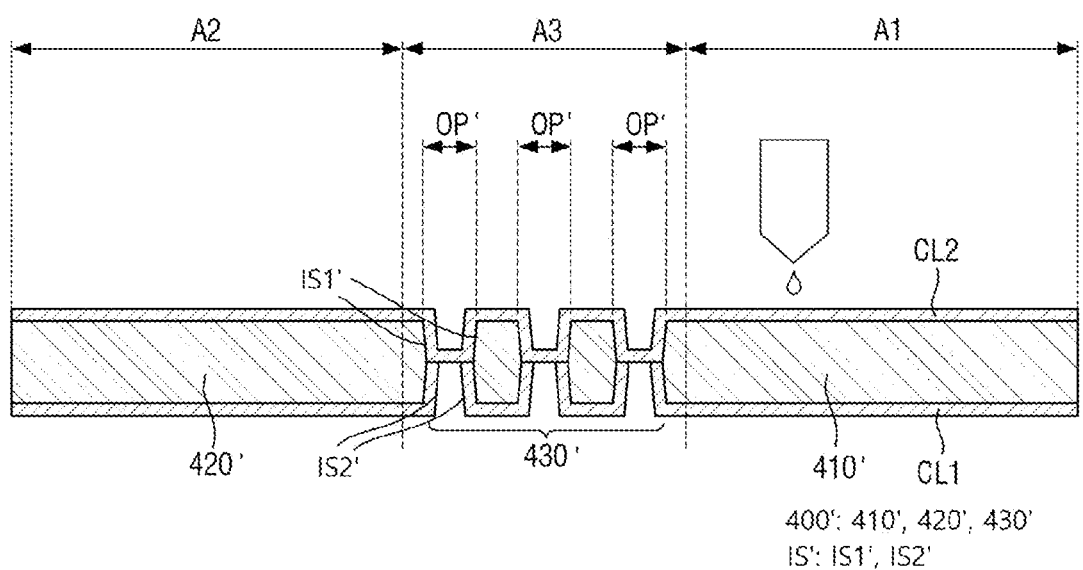

Referring to FIG. 18, after the first cured layer CL1 is cured, the second cured layer CL2 may be coated on the opposing surface of the support plate 400'. The second cured layer CL2 may include or be made of substantially a same material as the first cured layer CL1. In one embodiment, for example, the second cured layer CL2 may contain thermosetting PI. The second cured layer CL2 may be coated on the opposing surface of the first support portion 410', the opposing surface of the flexible portion 430', and the opposing surface of the second support portion 420'.

The second cured layer CL2 may be coated to cover the plurality of openings OP'. In such an embodiment, a part of the second cured layer CL2 may permeate the plurality of openings OP' and cover at least a part of the inner peripheral surfaces IS' defining the plurality of openings OP'.

Figure 19:
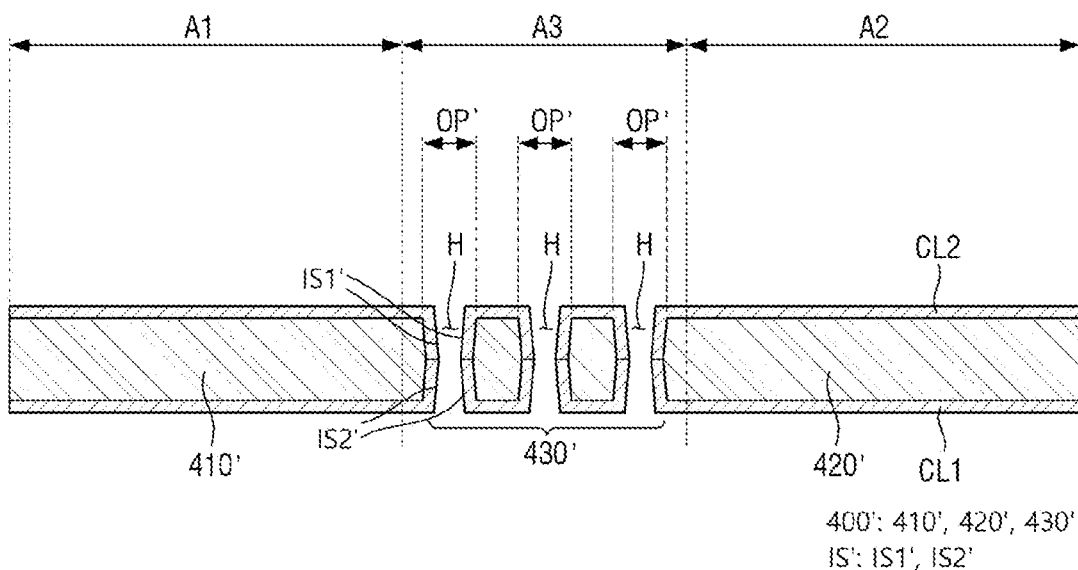

Referring to FIG. 19, the second cured layer CL2 may be thermally cured after the second cured layer CL2 is coated. In such an embodiment, as described above with reference to the first cured layer CL1, as the solvent in the second cured layer CL2 evaporates, a plurality of holes H may be formed in the second cured layer CL2 coated on the flexible portion 430' of the support plate 400'. The curing time of the second cured layer CL2 may also be adjusted to be enough to form the plurality of holes H.

After the curing of the second cured layer CL2 is completed, the coating layer 500 shown in FIG. 8 may be formed on the support plate 400'.

Referring further to FIG. 8, a part of the first cured layer CL1 disposed on one surface of the support plate 400' and a part of the second cured layer CL2 disposed on one surface of the support plate 400' may correspond to the first coating layer 510 and the second coating layer 520, respectively, and a part of the first cured layer CL1 and a part of the second cured layer CL2 disposed in the plurality of openings OP' may correspond to the third coating layer 530. In an embodiment, since the first cured layer CL1 and the second cured layer CL2 are formed sequentially, the third coating layer 530 may include the boundary between the first cured layer CL1 and the second cured layer CL2.

Hereinafter, referring further to FIGS. 1 to 4, the coated support plate 400' may be attached to the bottom surface of the display module DM. In an embodiment, although not shown, a method of manufacturing a display device may further include a process of attaching at least one member shown in FIG. 4 to the display module DM and/or the support member SM.

In an embodiment, although not shown, the method of manufacturing a display device may further include a process of forming a third cured layer having a Young's modulus greater than that of the first cured layer CL1 on the first cured layer CL1, and a process of forming a fourth cured layer having a Young's modulus greater than that of the second cured layer CL2 on the second cured layer CL2. The third cured layer and the fourth cured layer may be coated on the first cured layer CL1 and the second cured layer CL2, respectively, in a similar manner to that of the first cured layer CL1 and the second cured layer CL2. In one embodiment, for example, the first cured layer CL1 and the second cured layer CL2 may be the anti-peeling layers 510c1, 520c1, and 530c1 shown in FIG. 11, and the third cured layer and the fourth cured layer may be the high modulus layers 510c2, 520c2, and 530c2 shown in FIG. 11.

Figure 20:
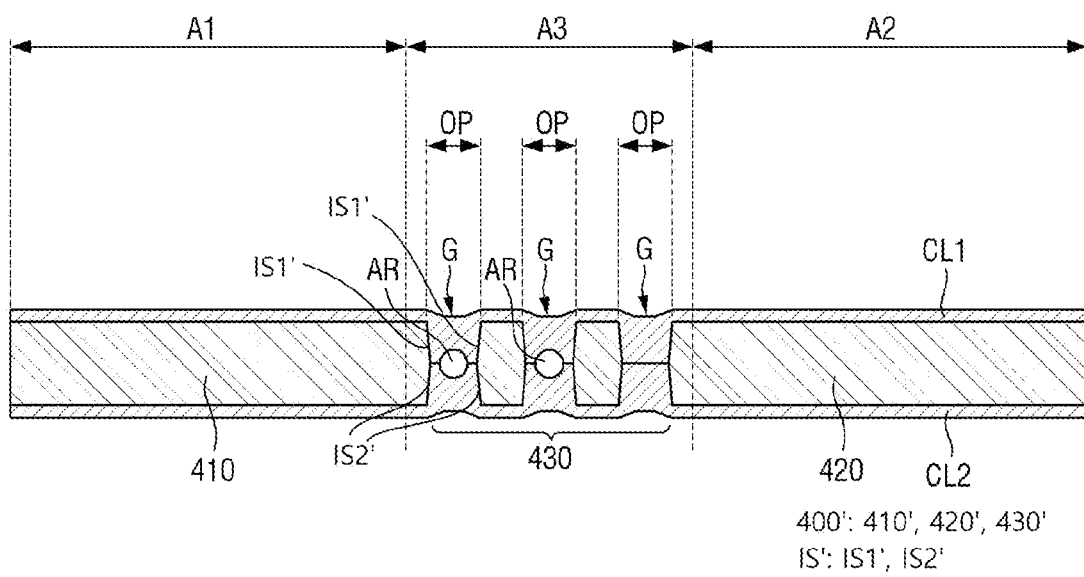
FIG. 20 is a diagram conceptually illustrating a method of manufacturing a display device according to an alternative embodiment.

FIG. 20 is a diagram conceptually illustrating a method of manufacturing a display device according to an alternative embodiment.

The embodiment of the method of manufacturing a display device shown in FIG. 20 is substantially the same as the embodiment of the method of manufacturing a display device shown in FIGS. 14 to 19 except that the curing time of the first cured layer CL1 and the second cured layer CL2 is adjusted in a way such that pores are formed.

Referring to FIGS. 16, 17 and 20, after the coating of the first cured layer CL1, the curing time of the first cured layer CL1 may be adjusted in a way such that no hole H is formed in the first cured layer CL1 disposed in the plurality of openings OP'. In such an embodiment, the first cured layer CL1 may be exposed to heat for a shorter period of time compared to the case of forming the holes H as shown in FIG. 16.

In an embodiment, referring to FIGS. 18, 19 and 20, after the coating of the second cured layer CL2, the curing time of the second cured layer CL2 may be adjusted in a way such that no hole H is formed in the second cured layer CL2 disposed in the plurality of openings OP'. In such an embodiment, the second cured layer CL2 may be exposed to heat for a shorter period of time compared to the case of forming the holes H as shown in FIG. 19.

In such an embodiment, a cured layer shown in FIG. 9 may be formed by adjusting the curing time of the first cured layer CL1 and the second cured layer CL2. In such an embodiment, pores may be formed in the plurality of openings OP' depending on the degree of curing of the first cured layer CL1 and the second cured layer CL2 and/or the degree of evaporation of the solvent.

Figure 21:
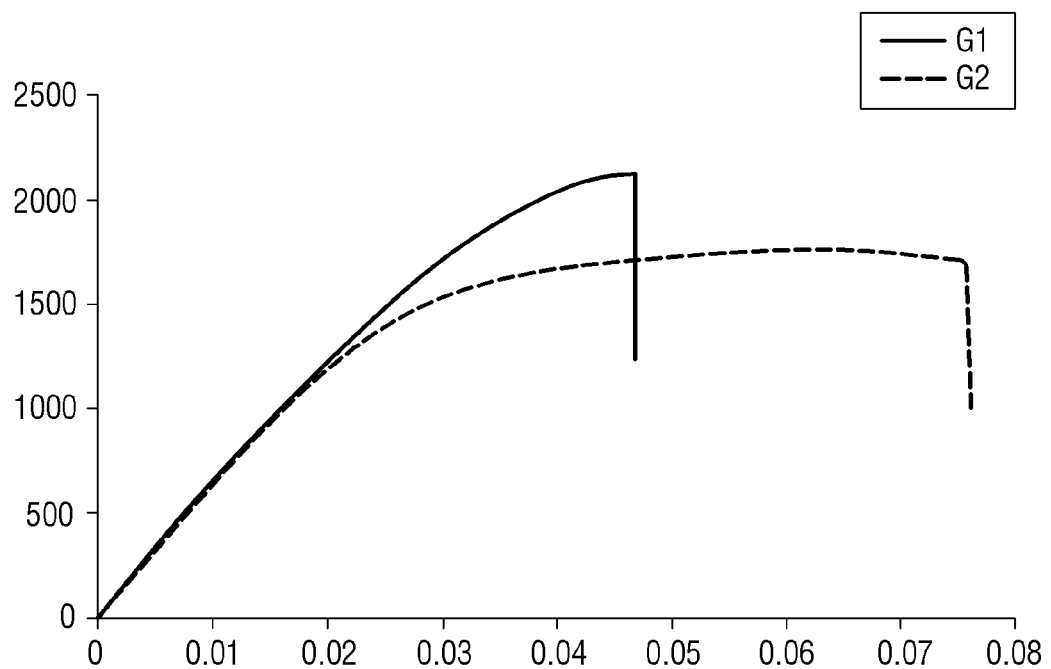
FIG. 21 is a graph showing stress-strain curves of a support plate coated with a coating layer and a support plate that is not coated with a coating layer.

FIG. 21 is a graph showing stress-strain curves of a support plate coated with a coating layer and a support plate that is not coated with a coating layer.

In the graph of FIG. 21, the horizontal axis indicates the stress (MPa) applied to a member, and the vertical axis indicates the strain of the member. In the graph, a first line G1 shows the stress-strain of the support plate 400 coated with the coating layer 500, and a second line G2 shows the stress-strain of the support plate 400 that is not coated with the coating layer 500. The support plate 400 may be made of an Invar material with a thickness of about 30 μm.

Referring to FIG. 21, the Young's modulus of the support plate 400 to which the coating layer 500 is not applied is about 58.86 GPa, and the Young's modulus of the supporting member SM to which the coating layer 500 is applied is about 66.17 GPa. The support plate 400 to which the coating layer 500 is applied has a yield strain of about 2.21%, whereas the support plate 400 to which the coating layer 500 is not applied has a yield strain of about 1.86%. Accordingly, in embodiments of the invention where the coating layer 500 is applied to the support plate 400, the Young's modulus and the yield strain of the support member SM are increased and, thus, the durability of the support member SM may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel including one surface, on which an image is displayed, and an opposing surface opposite to the one surface;
   a support plate disposed on the opposing surface of the display panel and including one surface facing the display panel and an opposing surface opposite to the one surface thereof, wherein a plurality of openings is defined through the support plate from the one surface to the opposing surface thereof in a thickness direction, such that the support plate further includes inclined inner peripheral surfaces defining the plurality of openings; and
   a coating layer disposed to surround the one surface of the support plate, the opposing surface of the support plate, and the inner peripheral surfaces of the support plate defining the plurality of openings.

2. The display device of claim 1, wherein the coating layer includes:
   a first coating layer disposed on the one surface of the support plate;
   a second coating layer disposed on the opposing surface of the support plate; and
   a third coating layer connected between the first coating layer and the second coating layer and disposed in the plurality of openings.

3. The display device of claim 2, wherein
   each of the inner peripheral surfaces defining the plurality of openings includes:
      a first inclined surface including one side connected to the one surface of the support plate; and
      a second inclined surface including one side connected to the opposing surface of the support plate, and another side connected to another side of the first inclined surface, and
   the third coating layer is disposed on the first inclined surface and the second inclined surface.

4. The display device of claim 3, wherein the first inclined surface and the second inclined surface are disposed in a way such that a width of a central portion between both ends of the plurality of openings is smaller than a width of the both ends of the plurality of openings.

5. The display device of claim 4, wherein the first inclined surface and the second inclined surface are disposed such that the inner peripheral surfaces of the opening protrudes toward a center of the opening.

6. The display device of claim 2, wherein the third coating layer is disposed on the inner peripheral surfaces defining the plurality of openings such that holes are defined by the third coating layer in the plurality of openings.

7. The display device of claim 2, wherein the third coating layer is disposed to fill the plurality of openings.

8. The display device of claim 7, wherein the third coating layer includes pores.

9. The display device of claim 1, wherein
the coating layer is disposed directly on the support plate, and
the coating layer includes an anti-peeling layer having a coefficient of thermal expansion matched to a coefficient of thermal expansion of the support plate, and a high modulus layer disposed on the anti-peeling layer and having a Young's modulus greater than a Young's modulus of the anti-peeling layer.

10. The display device of claim 9, wherein the coefficient of thermal expansion of the anti-peeling layer is in a range of about 0.8 to about 1.2 times the coefficient of thermal expansion of the support plate.

11. The display device of claim 9, wherein the high modulus layer has a Young's modulus of about 3.0 GPa or greater.

12. The display device of claim 1, wherein
the support plate includes a metal, and
the coating layer includes polyimide.

13. The display device of claim 1, wherein the support plate coated with the coating layer has a Young's modulus in a range of about 60 GPa to about 70 GPa.

14. The display device of claim 1, wherein the support plate coated with the coating layer has a yield strain of 0.02 or greater.

15. The display device of claim 1, wherein
the display panel includes a first non-folding area, a second non-folding area, and a folding area between the first non-folding area and the second non-folding area,
the support plate includes a first support portion disposed in the first non-folding area, a second support portion disposed in the second non-folding area, and a flexible portion disposed in the folding area, and
the plurality of openings are arranged in a grid pattern in the flexible portion.

* * * * *